(12) United States Patent
Choi et al.

(10) Patent No.: US 11,690,247 B2
(45) Date of Patent: Jun. 27, 2023

(54) DISPLAY PANEL AND DISPLAY APPARATUS INCLUDING COMPENSATION LAYER

(71) Applicant: SAMSUNG DISPLAY CO., LTD., Yongin-si (KR)

(72) Inventors: Kyunghyun Choi, Yongin-si (KR); Seongjun Lee, Yongin-si (KR); Kohei Ebisuno, Yongin-si (KR); Heeseong Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 62 days.

(21) Appl. No.: 17/325,587

(22) Filed: May 20, 2021

(65) Prior Publication Data

US 2021/0376292 A1 Dec. 2, 2021

(30) Foreign Application Priority Data

Jun. 2, 2020 (KR) .......................... 10-2020-0066676

(51) Int. Cl.
*H01L 51/52* (2006.01)
*H01L 27/32* (2006.01)
(Continued)

(52) U.S. Cl.
CPC ......... H10K 50/844 (2023.02); H10K 59/121 (2023.02); *H01L 27/14678* (2013.01);
(Continued)

(58) Field of Classification Search
CPC ............ H01L 51/5253; H01L 51/5275; H01L 51/5246; H01L 51/5293; H01L 51/5218;
(Continued)

(56) References Cited

U.S. PATENT DOCUMENTS 8,816,331 B2 8/2014 Choi et al.
9,761,651 B2 9/2017 Chang et al.
(Continued)

FOREIGN PATENT DOCUMENTS

CN 109300957 A 2/2019
EP 3486962 A2 5/2019
(Continued)

*Primary Examiner* — Ida M Soward
(74) *Attorney, Agent, or Firm* — Cantor Colburn LLP

(57) ABSTRACT

A display panel, in which a main display area, and a component area including a plurality of pixel groups and a transmission area are defined, includes a substrate, an inorganic insulating layer disposed on the substrate, where a first hole is defined through the inorganic insulating layer to correspond to the transmission area, a plurality of main display elements disposed on the inorganic insulating layer in the main display area, and a plurality of auxiliary display elements disposed on the inorganic insulating layer and corresponding to the pixel groups, respectively. The substrate includes a first base layer, a first barrier layer, a second base layer, a compensation layer, and a second barrier layer, which are stacked one on another, and a refractive index of the compensation layer has a value between a refractive index of the second base layer and a refractive index of the second barrier layer.

20 Claims, 17 Drawing Sheets

(51) Int. Cl.
*H01L 27/14* (2006.01)
*H10K 50/844* (2023.01)
*H10K 59/121* (2023.01)
*H01L 27/146* (2006.01)
*H10K 50/818* (2023.01)
*H10K 50/856* (2023.01)
*H10K 50/80* (2023.01)
*H10K 59/35* (2023.01)
*H10K 59/40* (2023.01)
*H10K 102/00* (2023.01)

(52) U.S. Cl.
CPC ......... *H10K 50/818* (2023.02); *H10K 50/856* (2023.02); *H10K 50/868* (2023.02); *H10K 59/1216* (2023.02); *H10K 59/35* (2023.02); *H10K 59/40* (2023.02); *H10K 2102/00* (2023.02); *H10K 2102/351* (2023.02)

(58) Field of Classification Search
CPC ........... H01L 51/5271; H01L 2251/301; H01L 2251/558; H01L 27/326; H01L 27/3218; H01L 27/3216; H01L 27/3272; H01L 27/3246; H01L 27/3248; H01L 27/3258; H01L 27/3262; H01L 27/3211; H01L 27/3265; H01L 27/323; H01L 27/14678
See application file for complete search history.

(56) References Cited

U.S. PATENT DOCUMENTS

| | | | |
|---|---|---|---|
| 10,276,640 B2 | 4/2019 | Chung et al. | |
| 2013/0140547 A1 | 6/2013 | Lee et al. | |
| 2016/0260904 A1 | 9/2016 | Park et al. | |
| 2020/0035950 A1* | 1/2020 | Seo | H01L 51/5271 |
| 2020/0052051 A1* | 2/2020 | Lee | H01L 27/1248 |
| 2020/0105844 A1 | 4/2020 | Wang et al. | |
| 2020/0258947 A1* | 8/2020 | Chung | H01L 27/3276 |
| 2020/0273927 A1* | 8/2020 | Oh | H01L 27/326 |
| 2020/0286972 A1* | 9/2020 | Seo | H01L 27/3276 |
| 2020/0295300 A1* | 9/2020 | Chung | H01L 51/5225 |
| 2020/0312934 A1* | 10/2020 | Bae | H01L 27/3248 |
| 2020/0365664 A1* | 11/2020 | Jeon | H01L 51/0027 |
| 2020/0365667 A1* | 11/2020 | Jo | H01L 51/56 |
| 2020/0373372 A1* | 11/2020 | Chung | H01L 27/3246 |
| 2020/0381502 A1* | 12/2020 | Song | H01L 27/3272 |
| 2020/0381665 A1* | 12/2020 | Song | H01L 51/5256 |
| 2020/0388784 A1* | 12/2020 | Kim | H01L 27/326 |
| 2020/0403180 A1* | 12/2020 | Seon | H01L 51/5253 |
| 2021/0083019 A1* | 3/2021 | Jang | H01L 27/326 |

FOREIGN PATENT DOCUMENTS

| | | |
|---|---|---|
| EP | 3588571 A1 | 1/2020 |
| KR | 1020120124224 A | 11/2012 |
| KR | 1020160106792 A | 9/2016 |
| KR | 1020160117728 A | 10/2016 |
| KR | 1020170029041 A | 3/2017 |

* cited by examiner

DISPLAY PANEL AND DISPLAY APPARATUS INCLUDING COMPENSATION LAYER

This application claims priority to Korean Patent Application No. 10-2020-0066676, filed on Jun. 2, 2020, and all the benefits accruing therefrom under 35 U.S.C. § 119, the content of which in its entirety is herein incorporated by reference.

BACKGROUND

1. Field

One or more embodiments relate to a display panel and a display apparatus including the display panel, and more particularly, to a display panel including an expanded display area to display images even in an area in which a component that is an electronic element is disposed, and a display apparatus including the display panel.

2. Description of Related Art

In recent years, the use of display apparatuses has diversified. In addition, because display apparatuses have become thinner and lighter, such display apparatuses are more widely used in various fields.

As display apparatuses are used in various fields, there may be various methods for designing the shape of a display apparatus, and providing functions combined with or linked to display apparatuses are increasing.

SUMMARY

One or more embodiments provide a display panel including an extended display area to display images even in an area where a component that is an electronic element is disposed, and a display apparatus including the display panel.

According to an embodiment, a display panel, in which a main display area, and a component area including a plurality of pixel groups spaced apart from one another and a transmission area between the pixel groups, are defined, includes a substrate, an inorganic insulating layer disposed on the substrate, where a first hole is defined through the inorganic insulating layer to correspond to the transmission area, a plurality of main display elements disposed on the inorganic insulating layer in the main display area, and a plurality of auxiliary display elements disposed on the inorganic insulating layer and corresponding to the pixel groups, respectively. In such an embodiment, the substrate includes a first base layer, a first barrier layer, a second base layer, a compensation layer, and a second barrier layer, which are sequentially stacked one on another, and a refractive index of the compensation layer has a value between a refractive index of the second base layer and a refractive index of the second barrier layer.

According to an embodiment, the second barrier layer may include silicon oxide, and the compensation layer may include silicon oxynitride.

According to an embodiment, a refractive index of the compensation layer may be in a range of about 1.65 to about 1.75.

According to an embodiment, a thickness of the compensation layer may be in a range of about 500 angstrom (Å) to about 2000 Å.

According to an embodiment, the first base layer and the second base layer may include polyimide.

According to an embodiment, a thickness of the first base layer may be greater than a thickness of the second base layer.

According to an embodiment, the display panel may further include a buffer layer disposed between the substrate and the inorganic insulating layer, where a buffer-hole may be defined through the buffer layer to correspond to the transmission area.

According to an embodiment, the display panel may further include a thin-film encapsulation layer disposed on the main display elements and the auxiliary display elements, where the thin-film encapsulation layer may include a first inorganic encapsulation layer, an organic encapsulation layer, and a second inorganic encapsulation layer, which are stacked one on another, and the first inorganic encapsulation layer may include a first refractive index and a second refractive index layer, which are stacked one on another. In such an embodiment, the first refractive index and the second refractive index layer may have different refractive indices from each other.

According to an embodiment, the first refractive index layer may include silicon oxynitride ($SiO_xN_y$, where x>0, y>0) and have a refractive index in a range of about 1.6 to about 1.7, and the second refractive index layer may include $SiO_xN_y$ (where x>0, y>0) and have a refractive index in a range of about 1.5 to about 1.6.

According to an embodiment, a thickness of the first base layer may be substantially the same as a thickness of the second base layer.

According to an embodiment, the display panel may further include a buffer layer disposed between the substrate and the inorganic insulating layer, where the buffer layer may include a first buffer layer and a second buffer layer on the first buffer layer, the first buffer layer may include silicon nitride, and a thickness of the first buffer layer may be in a range of about 80 Å to about 250 Å.

According to an embodiment, the second buffer layer may include silicon oxide, and a thickness of the second buffer layer may be in a range of about 1000 Å to about 4000 Å.

According to an embodiment, the display panel may further include a bottom metal layer disposed between the substrate and the inorganic insulating layer in the component area, where a bottom-hole is defined through the bottom metal layer to correspond to the transmission area.

According to another embodiment, a display apparatus includes a display panel, in which a display area including a plurality of main sub-pixels, and a component area including a plurality of pixel groups and a transmission area are defined, and a component disposed under the display panel to correspond to the component area. In such an embodiment, the display panel includes a substrate, an inorganic insulating layer disposed on the substrate, where a first hole is defined through the inorganic insulating layer to correspond to the transmission area, a plurality of main display elements disposed on the inorganic insulating layer in the main display area, and a plurality of auxiliary display elements disposed on the inorganic insulating layer and corresponding to the pixel groups, respectively. In such an embodiment, the substrate includes a first base layer, a first barrier layer, a second base layer, a compensation layer, and a second barrier layer, which are sequentially stacked one on another, and a refractive index of the compensation layer has a value between a refractive index of the second base layer and a refractive index of the second barrier layer.

According to an embodiment, the second barrier layer may include silicon oxide, and the compensation layer may include silicon oxynitride, and have a thickness in a range of about 500 Å to about 2000 Å.

According to an embodiment, a refractive index of the compensation layer may be in a range of about 1.65 to about 1.75.

According to an embodiment, the display panel may further include a buffer layer disposed between the substrate and the inorganic insulating layer, where a buffer-hole is defined through the buffer layer to correspond to the transmission area.

According to an embodiment, the display apparatus may further include a thin-film encapsulation layer disposed on the main display elements and the auxiliary display elements, where the thin-film encapsulation layer may include a first inorganic encapsulation layer, an organic encapsulation layer, and a second inorganic encapsulation layer, which are sequentially stacked one on another, and the first inorganic encapsulation layer may include a first refractive index layer and a second refractive index layer, which are stacked one on another. In such an embodiment, the first refractive index layer and the second index layer may have different refractive indices from each other, and a refractive index of the first refractive index layer may be in a range of about 1.6 to about 1.7, and a refractive index of the second refractive index layer may be in a range of about 1.5 to about 1.6.

According to an embodiment, the display apparatus may further include a buffer layer disposed between the substrate and the inorganic insulating layer, where the buffer layer may include a first buffer layer and a second buffer layer above the first buffer layer. In such an embodiment, the first buffer layer may include silicon nitride, and a thickness of the first buffer layer may be in a range of 80 Å to 250 Å.

According to an embodiment, the second buffer layer may include silicon oxide, and a thickness of the second buffer layer may be in a range of about 1000 Å to about 4000 Å.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
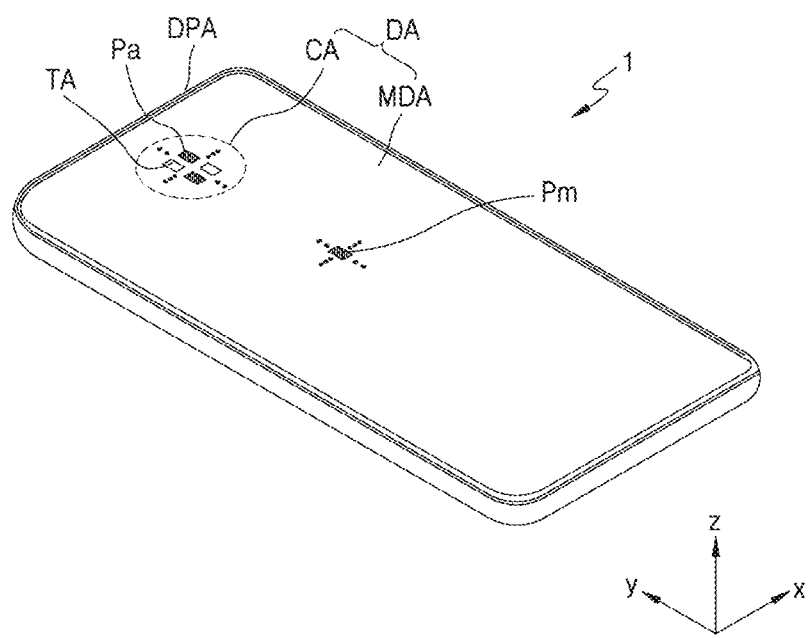
FIG. 1 is a perspective view schematically illustrating a display apparatus, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The disclosure may include a variety of transformations and may include various embodiments, and particular embodiments will be illustrated in the drawings and described in detail in the detailed description. Effects and features of the disclosure and methods for achieving them will be clarified with reference to embodiments described below in detail with reference to the drawings. However, the disclosure is not limited to the embodiments disclosed below, but may be implemented in various forms.

, and the same or corresponding components will be given the same reference numerals when describing with reference to the drawings, and redundant description thereof will be omitted.

It will be understood that when an element is referred to as being "on" another element, it can be directly on the other element or intervening elements may be present therebetween. In contrast, when an element is referred to as being "directly on" another element, there are no intervening elements present. In addition, for convenience of illustration, in the drawings, the size of components may be exaggerated or reduced. For example, because the size and thickness of each component shown in the drawings are arbitrarily shown for convenience of description, the embodiments are not necessarily limited to what is shown.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following embodiments, the x-axis, y-axis, and z-axis are not limited to three axes on the Cartesian coordinate system, and may be interpreted in a broad sense including them. For example, the x-axis, y-axis, and z-axis may be orthogonal to each other, but may refer to different directions that are not orthogonal to each other.

Hereinafter, embodiments will be described in detail with reference to the accompanying drawings.

FIG. 1 is a perspective view schematically illustrating a display apparatus 1, according to an embodiment.

Referring to FIG. 1, an embodiment of the display apparatus 1 includes a display area DA, and a peripheral area DPA outside the display area DA. The display area DA includes a component area CA, and a main display area MDA at least partially surrounding the component area CA. In such an embodiment, each of the component area CA and the main display area MDA may display images individually or together. The peripheral area DPA may be a type of non-display area in which display elements are not disposed. The display area DA may be entirely surrounded by the peripheral area DPA.

FIG. 1 shows an embodiment where a single component area CA is defined in the main display area MDA. In an alternative embodiment, the display apparatus 1 may include a plurality of component areas CA, and the plurality of component areas CA may be of different shapes and sizes from each other. When viewed in a direction substantially perpendicular to the upper surface of the display apparatus 1 or a thickness direction thereof (i.e., the z-axis direction), the component area CA may be of various shapes including a circle, an ellipse, a polygon such as a rectangle and the like, a star shape, or a diamond shape. In an embodiment, as shown in FIG. 1, when viewed from the direction substantially perpendicular to the upper surface of the display apparatus 1, the component area CA is located in an upper center of the main display area MDA (+y direction) of a substantially rectangular shape. Alternatively, the location of the component area CA may be variously modified, for example, the component area CA may be located on the upper right side or upper left side, of the rectangular main display area MDA.

The display apparatus 1 may provide or display an image using a plurality of main sub-pixels Pm disposed in the main display area MDA and a plurality of auxiliary sub-pixels Pa disposed in the component area CA.

In the component area CA, a component 40, which is an electronic element, may be located under the display panel corresponding to the component area CA, as described below with reference to FIG. 2. The component 40 may be a camera using infrared rays or visible light, and may include an imaging device. Alternatively, the component 40 may be a solar cell, a flash, an illuminance sensor, a proximity sensor, or an iris sensor. Alternatively, the component 40 may provide a function of receiving audio. In such an embodiment, the component area CA includes a transmission area TA, through which light or/and audio, etc. output from the component 40 to the outside or proceeding toward the component 40 from the outside may be transmitted, to minimize the limitation of the function of the component 40. In an embodiment of a display panel and a display apparatus including the display panel, light is effectively transmitted through the component area CA, and the light transmittance may be about 10% or more, for example, about 40% or more, about 25% or more, about 50% or more, about 85% or more, or about 90% or more.

A plurality of auxiliary sub-pixels Pa may be disposed in the component area CA. The plurality of auxiliary sub-pixels Pas emit light to provide a preset image. An image displayed in the component area CA is an auxiliary image, and may be a lower resolution than an image displayed in the main display area MDA. In such an embodiment, the component area CA includes a transmission area TA through which light and audio may be transmitted, and sub-pixels are not disposed on the transmission area TA, such that the number of the auxiliary sub-pixels Pas per unit area may be less than the number of the main sub-pixels Pm per unit area on the main display area MDA.

Figure 2:
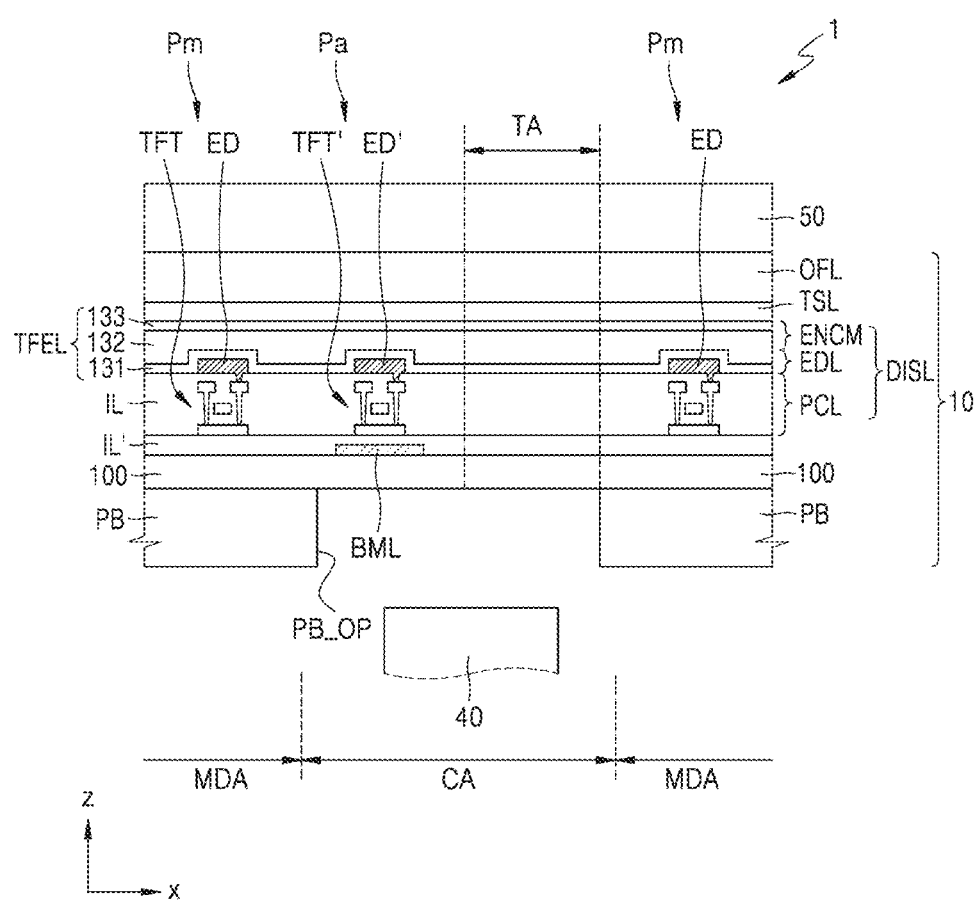
FIG. 2 is a cross-sectional view schematically illustrating a part of a display apparatus, according to an embodiment.

FIG. 2 is a cross-sectional view schematically showing a part of the display apparatus 1, according to an embodiment.

Referring to FIG. 2, an embodiment of the display apparatus 1 may include a display panel 10, and a component 40 overlapping the display panel 10. A cover window (not shown) for protecting the display panel 10 may be further disposed on the display panel 10.

The display panel 10 includes a component area CA, an area overlapping the component 40, and a main display area MDA in which a main image is displayed. The display panel 10 may include a substrate 100, a display layer DISL on the substrate 100, a touch screen layer TSL, an optical functional layer OFL, and a panel protective member PB located under the substrate 100.

The display layer DISL may include a circuit layer PCL including a thin-film transistor TFT and TFT', a display element layer EDL including an emission element ED and ED' that is a display element, and a sealing member ENCM such as a thin-film encapsulation layer TFEL or a sealing substrate (not shown). In such an embodiment, an insulating layer IL and IL' may be disposed between the substrate 100 and the display layer DISL.

The substrate 100 may include an insulating material such as polymer resin or the like, and may be a flexible substrate capable of bending, folding, rolling, or the like.

A main thin-film transistor TFT and a main emission device ED connected thereto may be disposed or located in the main display area MDA of the display panel 10 to implement a main sub-pixel Pm, and an auxiliary thin-film transistor TFT' and an auxiliary emission device ED' connected thereto may be located in the component area CA to implement an auxiliary sub-pixel Pa. An area, in which an auxiliary sub-pixel Pa is located, among the component area CA may be referred to as an auxiliary display area ADA.

In an embodiment, a transmission area TA with no display element may be defined or located in the component area CA. The transmission area TA may be an area through which light/signal emitted from the component 40 located corresponding to or to overlap the component area CA or light/signal incident on the component 40 is transmitted. The auxiliary display area ADA and the transmission area TA may be alternately disposed or arranged in the component area CA.

A bottom metal layer BML may be located in the component area CA. The bottom metal layer BML may be located to correspond to the bottom portion of the auxiliary thin-film transistor TFT'. In one embodiment, for example, the bottom metal layer BML may be located between the auxiliary thin-film transistor TFT' and the substrate 100. Such a bottom metal layer BML may block external light from reaching the auxiliary thin-film transistor TFT'. In an embodiment, a constant voltage or signal may be applied to the bottom metal layer BML to prevent damage to the pixel circuit due to electrostatic discharge.

The display element layer EDL may be covered with the thin-film encapsulation layer TFEL or a sealing substrate. In an embodiment, the thin-film encapsulation layer TFEL may include at least one inorganic encapsulation layer and at least one organic encapsulation layer, as shown in FIG. 2. In an embodiment, the thin-film encapsulation layer TFEL may include first and second inorganic encapsulation layers 131 and 133 and an organic encapsulation layer 132 therebetween.

The first and second inorganic encapsulation layers 131 and 133 may include at least one inorganic insulating material selected from aluminum oxide, titanium oxide, tantalum oxide, hafnium oxide, zinc oxide, silicon oxide, silicon nitride, and silicon oxynitride, for example. The organic encapsulation layer 132 may include a polymer-based material. The polymer-based material may include at least one selected from acrylic resin, epoxy resin, polyimide, and polyethylene.

In an embodiment where the display element layer EDL is sealed with the sealing substrate (not shown), the sealing substrate may be located to face the substrate 100 with the display element layer EDL located therebetween. A gap may exist between the sealing substrate and the display element layer EDL. The sealing substrate may include a glass. A sealant including a frit or the like may be located between the substrate 100 and the sealing substrate, and the sealant may be located in the peripheral area DPA described above. The sealant in the peripheral area DPA may prevent moisture from penetrating through the side surface while surrounding the display area DA.

The touch screen layer TSL may obtain coordinate information according to an external input, for example, a touch event. The touch screen layer TSL may include a touch electrode, and touch wires connected to the touch electrode. The touch screen layer TSL may detect external inputs using a self-capacitance method or a mutual capacitance method.

The touch screen layer TSL may be provided or formed on the thin-film encapsulation layer TFEL. Alternatively, the touch screen layer TSL may be separately formed on a touch substrate and then combined on the thin-film encapsulation layer TFEL through an adhesive layer such as optical clear adhesive ("OCA"). In an embodiment, the touch screen layer TSL may be formed directly on the thin-film encapsulation layer TFEL, and in such an embodiment, the adhesive layer may not be located between the touch screen layer TSL and the thin-film encapsulation layer TFEL.

The optical functional layer OFL may be a layer provided to improve visibility. The optical functional layer OFL may include an anti-reflection layer. The anti-reflection layer may reduce the reflectance of light (external light) incident from the outside toward the display apparatus 1.

In an embodiment, the anti-reflection layer may be a polarizing film. The polarizing film may include a linear polarizing plate and a phase delay film such as a quarter-wave ($\lambda/4$) plate. The phase delay film may be disposed on the touch screen layer TSL, and the linear polarizing plate may be disposed on the phase delay film.

In an embodiment, the anti-reflection layer may include a filter layer including black matrix and a plurality of color filters. The color filters may be disposed in consideration of the color of light emitted from each of the pixels of the display apparatus 1. In one embodiment, for example, the filter layer may include a red, green, or blue color filter.

In an embodiment, the anti-reflective layer may include a destructive interference structure. The destructive interference structure may include a first reflective layer and a second reflective layer, where the first reflective layer and the second reflective layer are disposed in different layers from each other. First reflected light and second reflected light, respectively reflected by the first reflective layer and the second reflective layer, may destructively interfere with each other, and thus, external light reflectance may be reduced.

A cover window 50 may be disposed on the top of the display panel 10 to protect the display panel 10. The optical functional layer OFL may be attached to the cover window 50 via the OCA, or may be attached to the touch screen layer TSL via the OCA.

The panel protective member PB may be attached to the bottom portion of the substrate 100 to support and protect the substrate 100. An opening PB_OP may be defined through the panel protective member PB to correspond to the component area CA. In such an embodiment, the light transmittance of the component area CA may be improved by providing the opening PB_OP in the panel protective member PB. The panel protective member PB may include polyethylene terephthalate ("PET") or polyimide ("PI").

The area of the component area CA may be greater than the area where the component 40 is located when viewed from a plan view in a thickness direction of the display panel 10 or the z-axis direction. Accordingly, an area of the opening PB_OP provided in the panel protective member PB may not match an area of the component area CA.

In an embodiment, a plurality of components 40 may be located in the component area CA. The plurality of components 40 may differ in function from each other. In one embodiment, for example, the plurality of components 40 may include at least two selected from a camera (or an imaging device), a solar cell, a flash, a proximity sensor, an illuminance sensor, and an iris sensor.

Figure 3:
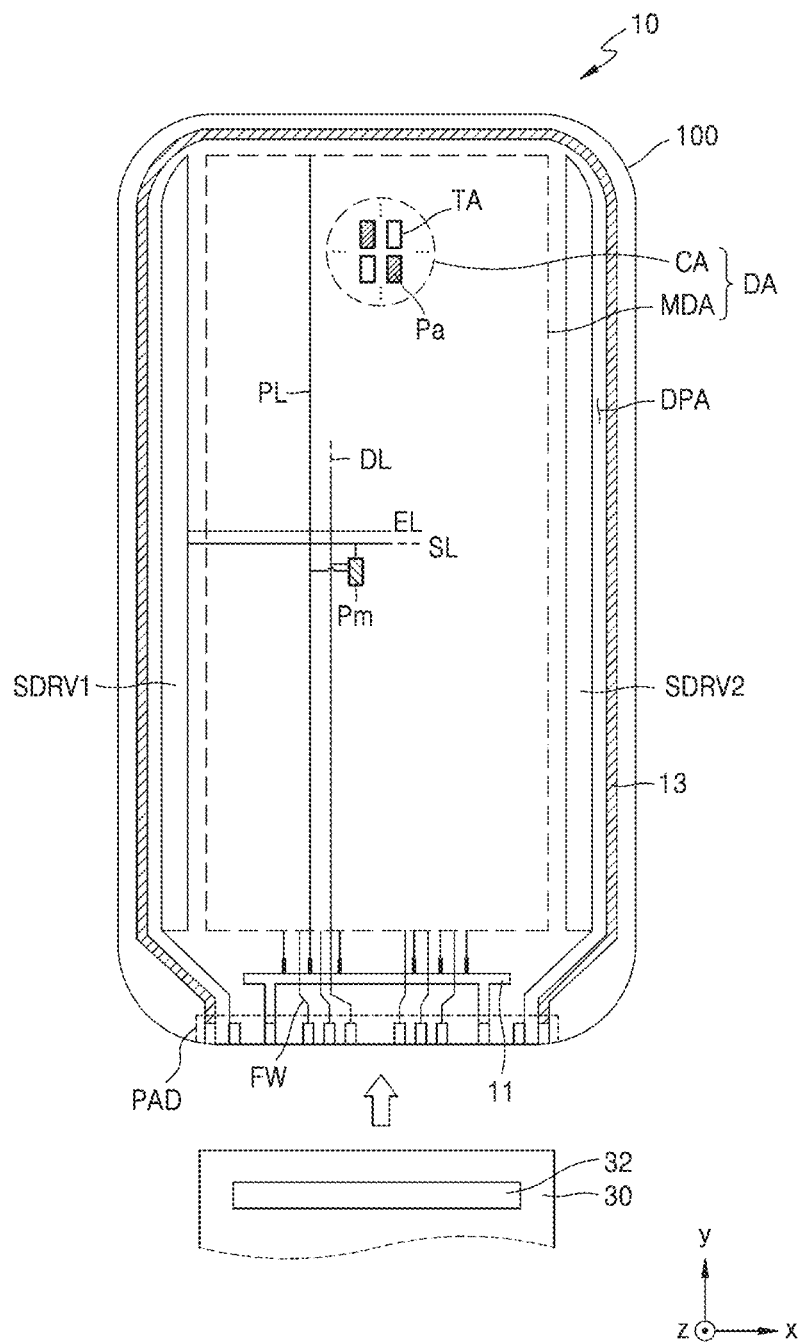
FIG. 3 is a plan view schematically illustrating a display panel in the display apparatus of FIG. 1, according to an embodiment.

FIG. 3 is a plan view schematically show illustrating the display panel 10, according to an embodiment.

Referring to FIG. 3, various components of the display panel 10 are located on the substrate 100. The substrate 100 includes a display area DA, and a peripheral area DPA surrounding the display area DA. The display area DA includes a main display area MDA in which a main image is displayed, and a component area CA including a transmission area TA and in which an auxiliary image is displayed. The auxiliary image may form a whole image together with the main image, and the auxiliary image may be an image independent from the main image.

In an embodiment, a plurality of main sub-pixels Pm are disposed in the main display area MDA. Each of the main sub-pixels Pm may be implemented as a display element such as an organic light-emitting diode ("OLED"). Each of the main sub-pixels Pm may emit red, green, blue or white light, for example. The main display area MDA is covered with a sealing member and may be protected from outside air or moisture.

The component area CA may be located on one side of the main display area MDA as described above, or may be disposed inside the display area DA and surrounded by the main display area MDA. A plurality of auxiliary sub-pixels Pa are disposed in the component area CA. Each of the plurality of auxiliary sub-pixels Pa may be implemented by a display element such as an OLED. The respective auxiliary sub-pixels Pa may emit red, green, blue or white light, for example. The component area CA is covered with a sealing member and may be protected from ambient air or moisture.

In an embodiment, the component area CA may include a transmission area TA. The transmission area TA may be located to surround the plurality of auxiliary sub-pixels Pa. Alternatively, the transmission area TA may be in a grid shape with the plurality of auxiliary sub-pixels Pa.

In such an embodiment where the component area CA includes the transmission area TA, the resolution of the component area CA may be lower than that of the main display area MDA. In one embodiment, for example, the resolution of the component area CA may be about ½, about ⅜, about ⅓, about ¼, about 2/9, about ⅛, about 1/9, about 1/16, etc. of the resolution of the main display area MDA. In one embodiment, for example, the resolution of the main display area MDA may be about 400 pixels per inch (ppi) or more, and the resolution of the component area CA may be about 200 ppi or about 100 ppi.

The pixel circuits driving the sub-pixels Pm and Pa may be electrically connected to the outer circuits disposed in the peripheral area DPA, respectively. In an embodiment, a first scan-driving circuit SDRV1, a second scan-driving circuit SDRV2, a terminal unit PAD, a driving-voltage supply line 11, and a common-voltage supply line 13 may be disposed in the peripheral area DPA.

The first scan-driving circuit SDRV1 may apply a scan signal to each of pixel circuits driving the sub-pixels Pm and Pa through a second scan line SL. The first scan-driving circuit SDRV1 may apply an emission control signal to each pixel circuit through an emission control line EL. The second scan-driving circuit SDRV2 may be located at the opposite side of the first scan-driving circuit SDRV1 around the main display area MDA, and may be approximately parallel to the first scan-driving circuit SDRV1. Some of the pixel circuits of the main sub-pixels Pm of the main display area MDA may be electrically connected to the first scan-driving circuit SDRV1, and the remaining of the pixel circuits of the main sub-pixels Pm of the main display area MDA may be electrically connected to the second scan-driving circuit SDRV2. Some of the pixel circuits of the auxiliary sub-pixels Pa of the component area CA may be electrically connected to the first scan-driving circuit SDRV1, and the remaining of the pixel circuits of the auxiliary sub-pixels Pa of the component area CA may be electrically connected to the second scan-driving circuit SDRV2. Alternatively, the second scan-driving circuit SDRV2 may be omitted.

The terminal unit PAD may be located at one side of the substrate 100. The terminal unit PAD is exposed without being covered by an insulating layer and is connected to a display circuit board 30. A display driver 32 may be located on the display circuit board 30.

The display driver 32 may generate control signals to be transmitted to the first scan-driving circuit SDRV1 and the second scan-driving circuit SDRV2. The display driver 32 generates a data signal, and the generated data signal may be transmitted to a pixel circuit of the sub-pixels Pm and Pa through a fan-out wiring FW and a data line DL connected to the fan-out wiring FW.

The display driver 32 may supply a driving voltage ELVDD to the driving-voltage supply line 11 and a common voltage ELVSS to the common-voltage supply line 13. The driving voltage ELVDD is applied to the pixel circuit of the sub-pixels Pm and Pa through a driving voltage line PL connected to driving-voltage supply line 11, and the common voltage ELVSS may be connected to the common-voltage supply line 13 and applied to an opposite electrode of a display element.

The driving-voltage supply line 11 may be provided to extend in the x direction at the bottom of the main display area MDA. The common-voltage supply line 13 is a shape e.g., a loop shape with one open side, and may partially surround the main display area MDA.

FIG. 3 shows an embodiment where a single component area CA is defined, but not being limited thereto. Alternatively, a plurality of component areas CA may be provided. In such an embodiment, the plurality of component area CAs may be spaced apart from each other, and a first camera may be located corresponding to one component area CA, and a second camera may be located corresponding to another component area CA. Alternatively, a camera may be located corresponding to one component area CA, and an infrared sensor may be located corresponding to another component area CA. The plurality of component areas CA may be provided in different shapes and sizes from each other.

In an embodiment, the component area CA may be provided as a polygon. In one embodiment, for example, the component area CA may be provided in an octagonal shape. The component area CA may be provided in a polygonal shape of various shapes such as a square or a hexagon. The component area CA may be surrounded by the main display area MDA.

Figure 4A:
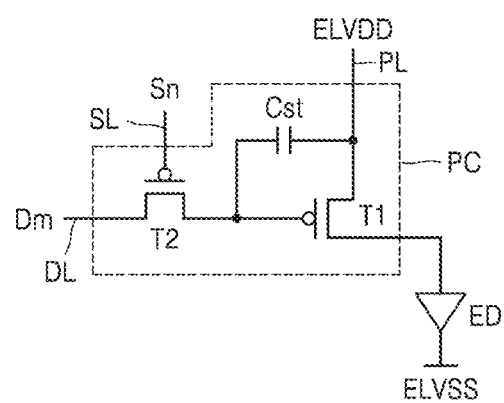
FIGS. 4A and 4B are equivalent circuit diagrams of a pixel circuit for driving sub-pixels, according to embodiments.
Figure 4B:
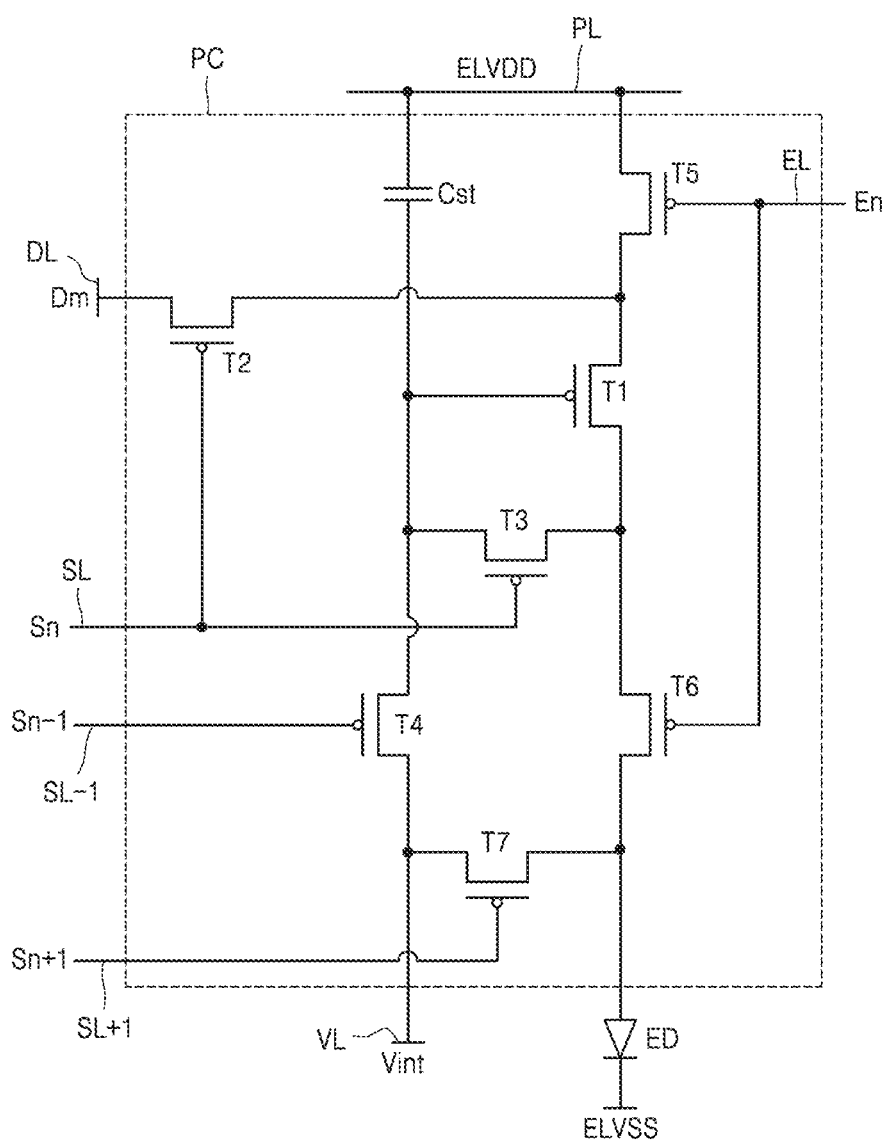

FIGS. 4A and 4B are equivalent circuit diagrams of a pixel circuit for driving sub-pixels Pm and Pa, according to embodiments.

Referring to FIG. 4A, an embodiment of a pixel circuit PC may be connected to an emission device ED such that the sub-pixels emit light. The pixel circuit PC includes a driving thin-film transistor T1, a switching thin-film transistor T2, and a storage capacitor Cst. The switching thin-film transistor T2 is connected to a scan line SL and a data line DL, and transmits, to the driving thin-film transistor T1, a data signal Dm input through the data line DL in response to a scan signal Sn input through the scan line SL.

The storage capacitor Cst is connected to the switching thin-film transistor T2 and a driving voltage line PL, and stores the voltage corresponding to a difference between a voltage received from the switching thin-film transistor T2 and a driving voltage ELVDD supplied to the driving voltage line PL.

The driving thin-film transistor T1 is connected to the driving voltage line PL and the storage capacitor Cst, and may control a driving current flowing from the driving voltage line PL to the emission device ED to correspond to a voltage value stored in the storage capacitor Cst. The emission device ED may emit light having a preset luminance corresponding to the driving current.

In an embodiment, as shown in FIG. 4A, the pixel circuit PC includes two thin-film transistors and a single storage capacitor, but the disclosure is not limited thereto.

Referring to FIG. 4B, in an alternative embodiment, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

In such an embodiment, as shown in FIG. 4B, signal lines SL, SL−1, SL+1, EL, and DL, an initialization voltage line VL, and a driving voltage line PL are provided for each pixel circuit PC, but the disclosure is not limited thereto. In another alternative embodiment, at least one of the signal lines SL, SL−1, SL+1, EL, and DL, and/or the initialization voltage line VL may be shared by neighboring pixel circuits.

In an embodiment, a drain electrode of the driving thin-film transistor T1 may be electrically connected to the emission device ED via the emission control thin-film transistor T6. The driving thin-film transistor T1 receives the data signal Dm based on a switching operation of the switching thin-film transistor T2 and supplies a driving current to the emission device ED.

A gate electrode of the switching thin-film transistor T2 is connected to the scan line SL, and a source electrode of the switching thin-film transistor T2 is connected to the data line DL. A drain electrode of the switching thin-film transistor T2 may be connected to the driving voltage line PL via the operation control thin-film transistor T5 while being connected to a source electrode of the driving thin-film transistor T1.

The switching thin-film transistor T2 is turned on in response to the scan signal Sn received through the scan line SL, and perform a switching operation to transmit the data signal Dm transmitted to the data line DL to the source electrode of the driving thin-film transistor T1.

A gate electrode of the compensation thin-film transistor T3 may be connected to the scan line SL. A source electrode of the compensation thin-film transistor T3 may be connected to a pixel electrode of the emission device ED via the emission control thin-film transistor T6 while being connected to the drain electrode of the driving thin-film transistor T1. A drain electrode of the compensation thin-film transistor T3 may be connected to the storage capacitor Cst, a source electrode of first initialization thin-film transistor T4, and a gate electrode of driving thin-film transistor T1 together. The compensation thin-film transistor T3 is turned on in response to a scan signal Sn received through the scan line SL, and connects the gate electrode and drain electrode of the driving thin-film transistor T1 to diode-connect the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. A source electrode of the first initialization thin-film transistor T4 may be connected to the storage capacitor Cst, the drain electrode of the compensation thin-film transistor T3, and the gate electrode of the driving thin-film transistor T1 together. The first initialization thin-film transistor T4 is turned on according to a previous scan signal Sn−1 received through the previous scan line SL−1, and transmits an initialization voltage Vint to the gate electrode of the driving thin-film transistor T1 to perform an initialization operation for initializing a voltage of the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of operation control thin-film transistor T5 is connected to the source electrode of driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. The drain electrode of the emission control thin-film transistor T6 may be electrically connected to the pixel electrode of the emission device ED. The operation control thin-film transistor T5 and the emission control thin-film transistor T6 are turned on simultaneously in response to an emission control signal En received through the emission control line EL, and the driving voltage ELVDD is transmitted to the emission device ED, and driving current flows in the emission device ED.

A gate electrode of the second initialization thin-film transistor T7 may be connected to a subsequent scan line SL+1. A source electrode of the second initialization thin-film transistor T7 may be connected to a pixel electrode of the emission device ED. A drain electrode of the second initialization thin-film transistor T7 may be connected to the initialization voltage line VL. The second initialization thin-film transistor T7 may be turned on in response to a subsequent scan signal Sn+1 received through the subsequent scan line SL+1, to initialize the pixel electrode of the emission device ED.

In an embodiment, as shown in FIG. 4, the first initialization thin-film transistor T4 and the second initialization thin-film transistor T7 are connected to the previous scan line SL−1 and the subsequent scan line SL+1, respectively, but the disclosure is not limited thereto. In an alternative embodiment, the first initialization thin-film transistor T4 and the second initialization thin-film transistor T7 may be both connected to the previous scan line SL−1, and may be driven based on the previous scan signal Sn−1.

one electrode of the storage capacitor Cst may be connected to the driving voltage line PL, and another electrode of the storage capacitor Cst may be connected to the gate electrode of the driving thin-film transistor T1, the drain electrode of the compensation thin-film transistor T3, and the source electrode of the first initialization thin-film transistor T4.

The counter electrode (e.g., cathode) of the emission device ED receives the common voltage ELVSS. The emission device ED emits light by receiving a driving current from the driving thin-film transistor T1.

The number of the thin-film transistors and storage capacitors and circuit design of the pixel circuit PC are not limited to those described with reference to FIGS. 4A and 4B, and the number and circuit design thereof may be variously modified.

The pixel circuit PC of a main sub-pixel Pm and the pixel circuit PC of an auxiliary sub-pixel Pa may be substantially the same as or different from each other. In one embodiment, for example, the pixel circuit PC for driving the main sub-pixel Pm and the auxiliary sub-pixel Pa may be the same as the pixel circuit PC shown in FIG. 4B. In an alternative embodiment, the pixel circuit PC for driving the main sub-pixel Pm may employ the pixel circuit PC shown in FIG. 4B, and the pixel circuit PC for driving the auxiliary sub-pixel Pa may employ the pixel circuit PC shown in FIG. 4A.

Figure 5:
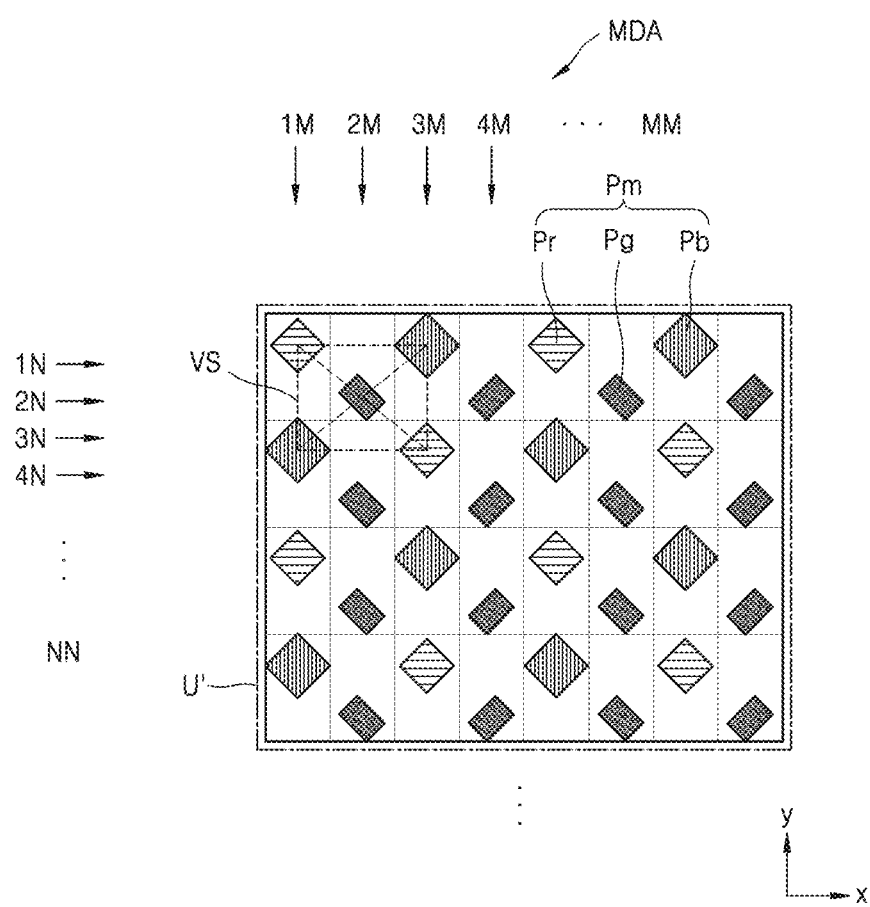
FIG. 5 is a plan view schematically illustrating a pixel arrangement structure in a main display area, according to an embodiment.

FIG. 5 is a plan view schematically illustrating a pixel arrangement structure in a main display area, according to an embodiment.

In an embodiment, a plurality of main sub-pixels Pm may be disposed in the main display area MDA. Herein, a sub-pixel refers to an emitting area as a minimum unit for realizing an image. In an embodiment, where an OLED is used as a display element, the emission area may be defined by an opening of a pixel defining layer. This will be described later below.

In an embodiment, as shown in FIG. 5, the main sub-pixels Pm disposed in the main display area MDA may be disposed in a PenTile structure. The main sub-pixels Pm may include a first sub-pixel Pr, a second sub-pixel Pg, and a third sub-pixel Pb, and the first sub-pixel Pr, the second sub-pixel Pg, and the third sub-pixel Pb may implement red, green, and blue, respectively.

A plurality of first sub-pixels Pr and a plurality of third sub-pixels Pb are alternately disposed in a first row 1N, a plurality of second sub-pixels Pg are spaced apart at a preset interval in an adjacent second row 2N, the third sub-pixel Pb and the first sub-pixel Pr are alternately disposed in an adjacent third row 3N, and the plurality of second sub-pixels Pg are spaced apart at a preset interval in an adjacent fourth row 4N. In such an embodiment, the arrangement of such pixels is repeated up to an N-th row NN. In an embodiment, the third sub-pixel Pb and the first sub-pixel Pr may be provided larger than the second sub-pixel Pg.

The plurality of first sub-pixels Pr and third sub-pixels Pb disposed in the first row 1N and the plurality of second sub-pixels Pg disposed in the second row 2N are staggered. Therefore, the first sub-pixel Pr and the third sub-pixel Pb are alternately disposed in a first column 1M, and the plurality of second sub-pixels Pg are disposed at a preset interval in an adjacent second column 2M, the third sub-pixel Pb and first sub-pixel Pr are alternately disposed in an adjacent third column 3M, and the plurality of second sub-pixels Pg are disposed at a preset interval in an adjacent fourth column 4M, and the arrangement of pixels is repeated up to an M-th column MM.

In such an embodiment, the first sub-pixel Pr is disposed at first and third vertices facing each other among vertices of a virtual square VS with the center point of the second sub-pixel Pg as the center point of the rectangle, and the third sub-pixel Pb is disposed at second and fourth vertices which are the remaining vertices. In such an embodiment, the virtual square VS may be modified in various ways, such as rectangle, rhombus, and square.

Such a pixel arrangement structure is referred to as a PenTile matrix structure or a PenTile structure, and high resolution may be realized with a small number of pixels by applying a rendering driving method that expresses colors by sharing adjacent pixels.

In an embodiment, as shown in FIG. 5, the plurality of main sub-pixels Pm are disposed in a PenTile matrix structure, but the disclosure is not limited thereto. In one embodiment, for example, the plurality of main sub-pixels Pm may be disposed in one of various shapes or arrangements such as a stripe structure, a mosaic array structure, and a delta array structure.

Figure 6A:
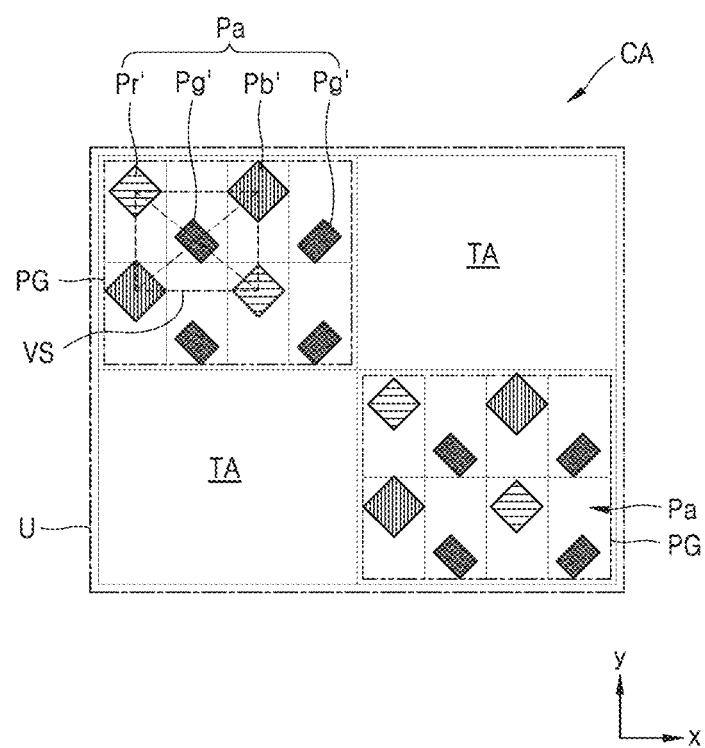
FIGS. 6A and 6B are plan views schematically illustrating a pixel arrangement structure in a component area, according to embodiments.
Figure 6B:
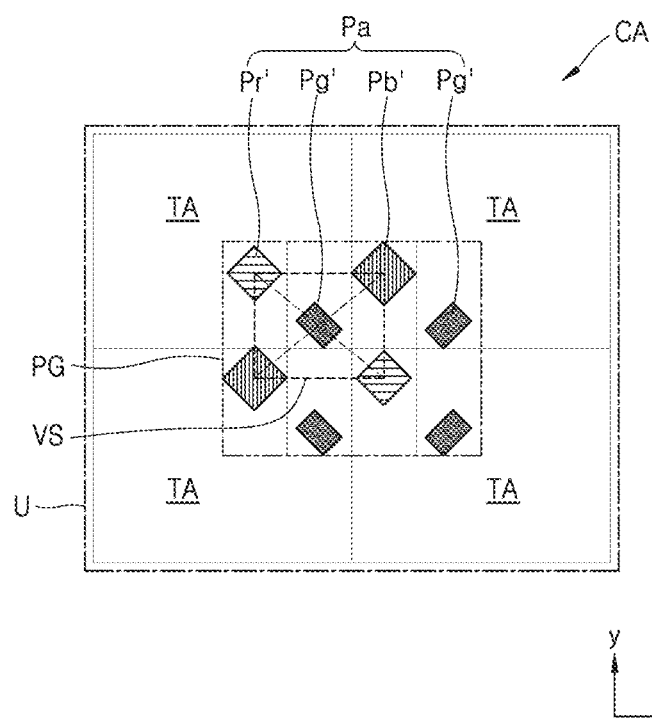

FIGS. 6A and 6B are plan views schematically illustrating a pixel arrangement structure in a component area CA, according to an embodiment.

Referring to FIG. 6A, in an embodiment, a plurality of auxiliary sub-pixels Pa may be disposed in the component area CA. Each of the auxiliary sub-pixels Pa may emit light of one of red, green, blue, and white.

The component area CA may include a pixel group PG including at least one auxiliary sub-pixel Pa, and a transmission area TA. The pixel group PG and the transmission area TA are alternately disposed along the x-axis direction and the y-axis direction, and may be disposed in, for example, a lattice shape. In such an embodiment, the component area CA may include a plurality of pixel groups PG and a plurality of transmission areas TA.

The pixel group PG may be defined as a sub-pixel aggregate in which the plurality of auxiliary sub-pixels Pa are grouped in preset units. In one embodiment, for example, as shown in FIG. 6A, one pixel group PG may include eight auxiliary sub-pixels Pa disposed in a PenTile structure. In such an embodiment, one pixel group PG may include two first sub-pixels Pr, four second sub-pixels Pg', and two third sub-pixels Pb'.

In the component area CA, a basic unit U in which a preset number of pixel groups PG and a preset number of transmission areas TA are bound may be repeatedly disposed in the x direction and the y direction. In an embodiment, as shown in FIG. 6A, the basic unit U may be a shape in which two pixel groups PG and two transmission areas TA disposed around the two pixel groups PG are bound in a square shape. The basic unit U is a division of repetitive shapes, and does not mean a break in the composition.

In an embodiment, a corresponding unit U' may be provided in the main display area MDA with a same area as the area of the basic unit U. In an embodiment, the number of main sub-pixels Pm included in the corresponding unit U' may be greater than the number of auxiliary sub-pixels Pa included in the basic unit U. In one embodiment, for example, the number of the auxiliary sub-pixels Pa included in the basic unit U may be 16, and the number of the main sub-pixels Pm included in the corresponding unit U' may be 32, where the number of the auxiliary sub-pixels Pa and the number of the main sub-pixels Pm may be provided in a ratio of 1:2.

The arrangement structure of auxiliary sub-pixels Pa as shown in FIG. 6A is a PenTile structure, and the pixel arrangement structure of the component area CA of which a resolution is provided ½ as compared to the main display area MDA may be referred to as a ½ PenTile structure. The number or arrangement of auxiliary sub-pixels Pa included in the pixel group PG may be modified based on a resolution of the component area CA.

Referring to FIG. 6B, in an alternative embodiment, the pixel arrangement structure of the component area CA may be provided in a ¼ PenTile structure. In one embodiment, for example, eight auxiliary sub-pixels Pa are disposed in a PenTile structure in the pixel group PG, but only one pixel group PG may be included in the basic unit U. The remaining area of the basic unit U may be provided as the transmission area TA. Therefore, the number of the auxiliary sub-pixels Pa and the number of the main sub-pixels Pm per a same unit area may be provided in a ratio of 1:4. In such an embodiment, one pixel group PG may be surrounded by the transmission area TA.

FIGS. 7A and 7B show that the plurality of auxiliary sub-pixels Pa are disposed in a PenTile matrix structure, but the disclosure is not limited thereto. In one embodiment, for example, the plurality of auxiliary sub-pixels Pa may be disposed in one of various shapes or arrangements such as a stripe structure, a mosaic array structure, and a delta array structure.

In an embodiment, the size of the auxiliary sub-pixel Pa in FIGS. 6A and 6B may be the same as the size of the main sub-pixel Pm in FIG. 5, but the disclosure is not limited thereto. The size of the auxiliary sub-pixel Pa may be provided larger than the size of the main sub-pixel Pm of a same color. In one embodiment, for example, the size of a blue pixel Pb' of the auxiliary sub-pixel Pa may be greater than that of a blue pixel Pb of the main sub-pixel Pm. The difference in size may be designed in consideration of differences in luminance and/or resolution between the component area CA and the main display area MDA.

Figure 7:
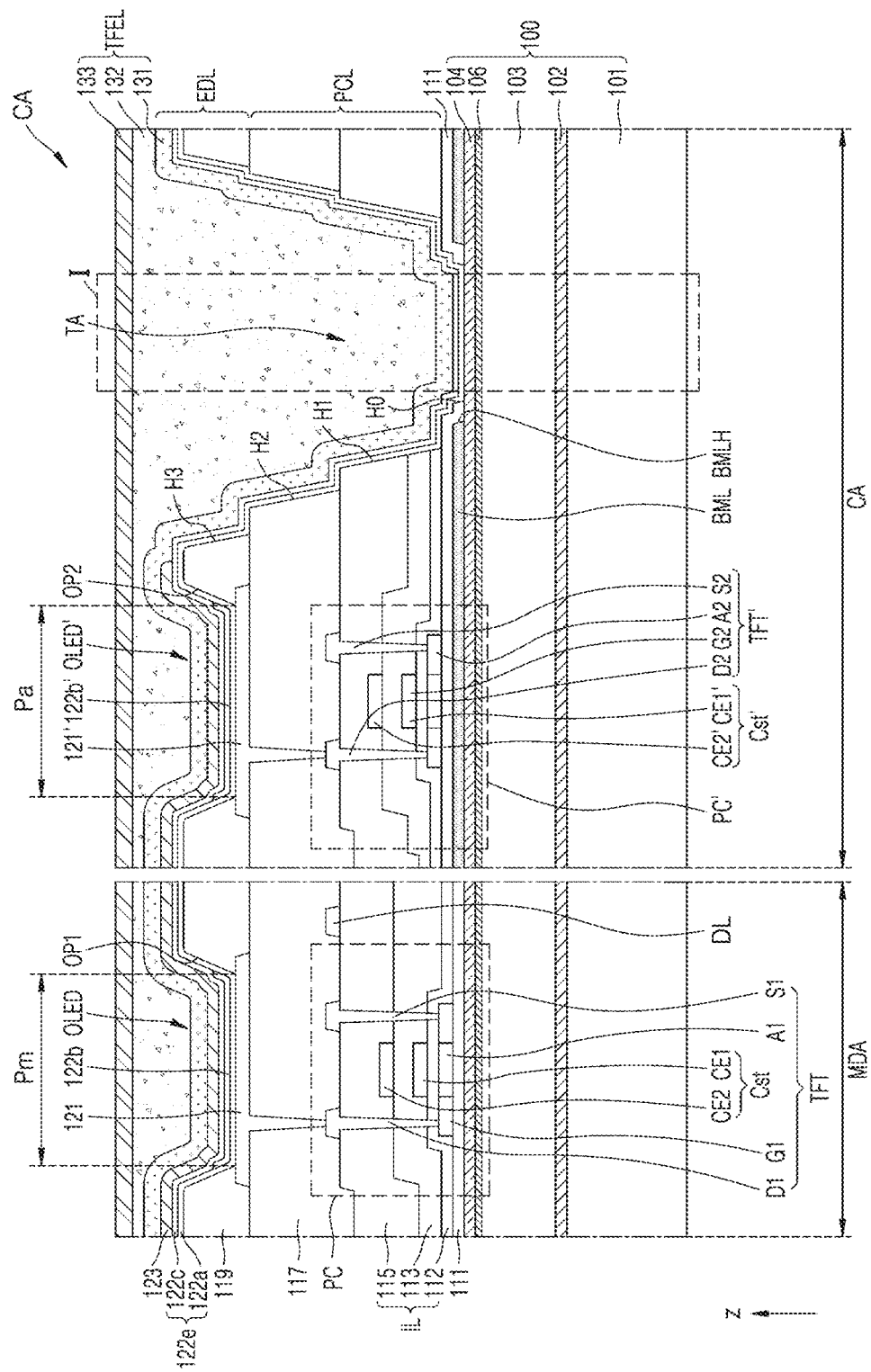
FIG. 7 shows a schematic cross-sectional view illustrating a part of a display panel according to an embodiment, and a cross-sectional view schematically illustrating a main display area and a component area.
Figure 8:
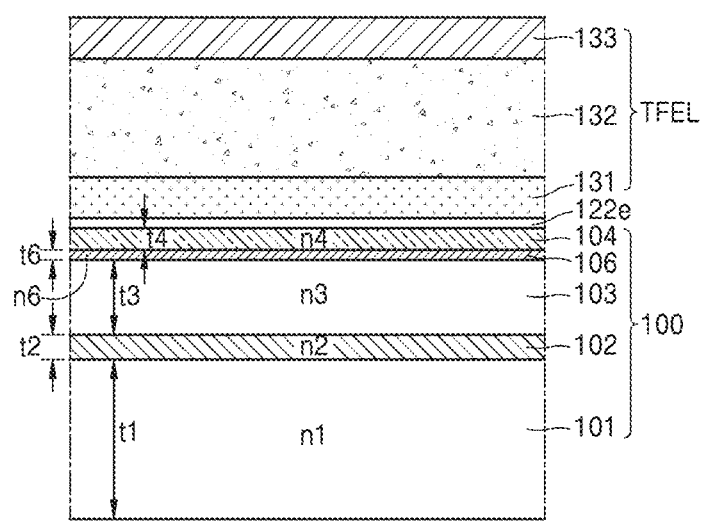
FIG. 8 is a cross-sectional view corresponding to region I of FIG. 7 and schematically illustrating a stacked structure of a transmission area.

FIG. 7 is a schematic cross-sectional view illustrating part of the display panel 10 according to an embodiment, and a cross-sectional view schematically illustrating the main display area MDA and the component area CA. FIG. 8 is a cross-sectional view corresponding to region I of FIG. 7 and schematically illustrating a stacked structure of a transmission area TA.

Referring to FIG. 7, an embodiment of the display panel 10 includes a main display area MDA and a component area CA. In such an embodiment, a main sub-pixel Pm is disposed in In the main display area MDA, and the component area CA includes an auxiliary sub-pixel Pa and a transmission area TA. The main display area MDA includes a main pixel circuit PC including a main thin-film transistor TFT and a main storage capacitor Cst, and an OLED, which is a display element connected to the main pixel circuit PC. The component area CA includes an auxiliary pixel circuit PC' including an auxiliary thin-film transistor TFT' and an auxiliary storage capacitor Cst', and an auxiliary OLED OLED', which is a display element connected to the auxiliary pixel circuit PC'.

In an embodiment, an OLED is used as a display element, but not being limited thereto. In one alternative embodiment, for example, an inorganic light-emitting element or a quantum dot light-emitting element may be employed as a display element.

Hereinafter, a structure in which the components included in the display panel 10 are stacked will be described in detail. The display panel 10 may be provided by stacking the substrate 100, a buffer layer 111, the circuit layer PCL, the display element layer EDL, and the thin-film encapsulation layer TFEL as a sealing member.

The substrate 100 may include an insulating material such as polymer resin or the like. The substrate 100 may be a flexible substrate capable of bending, folding, rolling, or the like.

The buffer layer 111 may be disposed on the substrate 100 to reduce or block the penetration of foreign matter, moisture or outside air from the bottom of the substrate 100, and provide a flat surface on the substrate 100. The buffer layer 111 may include an inorganic material such as an oxide or nitride, or an organic material, or an organic-inorganic composite, and may have a single layer or multi-layer structure, each layer including the inorganic material or the organic material. In such an embodiment, a barrier layer (not shown) may be disposed between the substrate 100 and the buffer layer 111 to block the infiltration of outside air. In an embodiment, the buffer layer 111 may include silicon oxide ($SiO_x$) or silicon nitride ($SiN_x$). In an embodiment, the buffer layer 111 may be provided by stacking silicon oxide ($SiO_x$) and silicon nitride ($SiN_x$).

In an embodiment, the bottom metal layer BML may be disposed in the component area CA between a first buffer layer 111a and a second buffer layer 111b. In an alternative embodiment, the bottom metal layer BML may be disposed between the substrate 100 and the first buffer layer 111a. The bottom metal layer BML is disposed under the auxiliary pixel circuit PC' so that the deterioration of the characteristics of the auxiliary thin-film transistor TFT' due to light emitted from a component or the like may be prevented. In an embodiment, the bottom metal layer BML may prevent light emitted from a component or the like and directed to the component from diffracting through a narrow gap between wirings connected to the auxiliary pixel circuit PC'. The bottom metal layer BML may be omitted in the transmission area TA.

A bias voltage may be applied to the bottom metal layer BML. The bottom metal layer BML may effectively reduce the probability of the generation of electrostatic discharge when a bias voltage is provided. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be a single layer or multiple layers, each layer including at least one selected from the aforementioned materials.

The circuit layer PCL is disposed on the buffer layer 111, and may include the pixel circuits PC and PC', a first gate insulating layer 112, a second gate insulating layer 113, an interlayer insulating layer 115, and a planarization layer 117. The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The main thin-film transistor TFT and the auxiliary thin-film transistor TFT' may be disposed on the buffer layer 111. The main thin-film transistor TFT includes the first semiconductor layer A1, the first gate electrode G1, the first source electrode S1, and the first drain electrode D1, and the auxiliary thin-film transistor TFT' includes the second semiconductor layer A2, the second gate electrode G2, the second source electrode S2, and the second drain electrode D2. The main thin-film transistor TFT may be connected to the main OLED OLED to drive the main OLED OLED. The auxiliary thin-film transistor TFT' may be connected to the auxiliary OLED OLED' to drive the auxiliary OLED OLED'.

In an embodiment, the first semiconductor layer A1 and the second semiconductor layer A2 are disposed on the buffer layer 111 and may include polysilicon. In an alternative embodiment, the first semiconductor layer A1 and the second semiconductor layer A2 may include amorphous silicon. In another alternative embodiment, the first semiconductor layer A1 and the second semiconductor layer A2 may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may include a channel area, and source and drain areas that are doped with impurities.

The second semiconductor layer A2 may overlap the bottom metal layer BML with the second buffer layer 111b therebetween. In an embodiment, a width of the second semiconductor layer A2 may be less than a width of the bottom metal layer BML, and thus, when viewed from a plan view in the z-axis direction or a view projected in a direction perpendicular to the substrate 100, the second semiconductor layer A2 may overlap the bottom metal layer BML as a whole.

The first gate insulating layer 112 may cover the first semiconductor layer A1 and the second semiconductor layer A2. The first gate insulating layer 112 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$). The first gate insulating layer 112 may be a single layer or multiple layers, each layer including at least one selected from the above-described inorganic insulating materials.

The first gate electrode G1 and the second gate electrode G2 are disposed on the first gate insulating layer 112 to overlap the first semiconductor layer A1 and the second semiconductor layer A2, respectively. The first gate electrode G1 and the second gate electrode G2 include molybdenum (Mo), aluminum (Al), copper (Cu), titanium (Ti), or the like, and may be a single layer or multiple layers. In one embodiment, for example, the first gate electrode G1 and the second gate electrode G2 may be a single layer of Mo.

The second gate insulating layer 113 may cover the first gate electrode G1 and the second gate electrode G2. The second gate insulating layer 113 may include an inorganic insulating material such as $SiO_x$, $SiN_x$, SiON, $Al_2O_3$, $TiO_2$, $Ta_2O_5$, $HfO_2$, $ZnO_2$. The second gate insulating layer 113 may be a single layer or multiple layers, each layer including at least one selected from the above-described inorganic insulating materials.

The second gate insulating layer 113 may include a first upper electrode CE2 of the main storage capacitor Cst and a second upper electrode CE2' of the auxiliary storage capacitor Cst'.

In an embodiment, the first upper electrode CE2 may overlap the first gate electrode G1 below the first upper electrode CE2 in the main display area MDA. The first gate electrode G1 and the first upper electrode CE2 overlapping each other with the second gate insulating layer 113 therebetween may collectively define the main storage capacitor Cst. The first gate electrode G1 may be a first lower electrode CE1 of the main storage capacitor Cst.

In an embodiment, the second upper electrode CE2' may overlap the second gate electrode G2 below the second upper electrode CE2' in the component area CA. The second gate electrode G2 and the second upper electrode CE2' overlapping each other with the second gate insulating layer 113 therebetween may collectively define the auxiliary storage capacitor Cst'. The first gate electrode G1 may be a second lower electrode CE1' of the auxiliary storage capacitor Cst'.

The first upper electrode CE2 and the second upper electrode CE2' may include Al, Pt, Pd, Ag, Mg, Au, Ni, Nd, Ir, Cr, Ca, Mo, Ti, W, and/or Cu, and may be a single layer or multiple layers, each layer including at least one selected from the aforementioned materials.

The interlayer insulating layer 115 may cover the first upper electrode CE2 and the second upper electrode CE2'. The interlayer insulating layer 115 may include $SiO_x$, $SiN_x$, SiON, $Al_2O_3$, $TiO_2$, $Ta_2O_5$, $HfO_2$, or $ZnO_2$. The interlayer insulating layer 115 may be a single layer or multi layers, each layer including at least one selected from the above-described inorganic insulating materials.

In an embodiment, where the first gate insulating layer 112, the second gate insulating layer 113, and the interlayer insulating layer 115 are collectively referred to as (or collectively define) an inorganic insulating layer IL, a first hole H1 may be defined through the inorganic insulating layer IL to correspond to the transmission area TA. The first hole H1 may expose a part of the upper surface of the buffer layer 111 or the substrate 100. The first hole H1 may be formed by overlapping an opening of the first gate insulating layer 112, an opening of the second gate insulating layer 113, and an opening of the interlayer insulating layer 115, where the openings are defined or formed therethrough to correspond to the transmission area TA. These openings may be respectively formed through separate processes or may be formed simultaneously through a same process. In an embodiment, where these openings are formed in separate processes, an inner surface of the first hole H1 may not be smooth and may include a staircase-like step.

In an embodiment, a buffer-hole H0 may be defined through the buffer layer 111 to correspond to the transmission area TA. The buffer-hole H0 may expose a part of the upper surface of the substrate 100. The area of the buffer-hole H0 may be less than the area of the first hole H1. In such an embodiment, where holes H1 and H0 are defined through the buffer layer 111 and the inorganic insulating layer IL to correspond to the transmission area TA, respectively, light transmittance of the component area CA may be improved.

The data line DL, the source electrodes S1 and S2, and the drain electrodes D1 and D2 may be disposed on the interlayer insulating layer 115. The data line DL, the source electrodes S1 and S2, and the drain electrodes D1 and D2 may include a conductive material including molybdenum (Mo), aluminum (Al), copper (Cu), titanium (Ti), or the like, and may be multiple layers or a single layer, each layer including at least one selected from the aforementioned materials. In one embodiment, for example, the data line DL, the source electrodes S1 and S2, and the drain electrodes D1 and D2 may have a multi-layer structure of Ti/Al/Ti.

The planarization layer 117 may be disposed to cover the data line DL, the source electrodes S1 and S2, and the drain electrodes D1 and D2. The planarization layer 117 may include a flat upper surface so that a first pixel electrode 121 and a second pixel electrode 121' thereon may be disposed stably on a flat surface.

The planarization layer 117 may include an organic material or an inorganic material, and may have a single-layer structure or a multi-layer structure. The planarization layer 117 may include a general-purpose polymer such as benzocyclobutene ("BOB"), PI, hexamethyldisiloxane ("HMDSO"), poly(methyl methacrylate) ("PMMA"), or polystyrene ("PS"), a polymer derivative including a phenolic group, acrylic polymers, imide polymers, aryl ether polymers, amide polymers, fluorine polymers, p-xylene polymers, or vinyl alcohol polymers. In an embodiment, the planarization layer 117 may include an inorganic insulating material such as $SiO_x$, $SiN_x$, SiON, $Al_2O_3$, $TiO_2$, $Ta_2O_5$, $HfO_2$, or $ZnO_2$. In an embodiment, in a process of forming the planarization layer 117, chemical and mechanical polishing may be performed on the upper surface of the layer to provide a flat upper surface after forming the layer.

In an embodiment, a second hole H2 may be defined through the planarization layer 117 to correspond to the transmission area TA. The second hole H2 may overlap the first hole H1. FIG. 8 shows an embodiment where the second hole H2 is formed larger than the first hole H1. In an alternative embodiment, the planarization layer 117 is provided to cover the edge of the first hole H1 of the inorganic insulating layer IL so that the area of the second hole H2 may be formed to be less than the area of the first hole H1.

In an embodiment, a via hole may be defined through the planarization layer 117 to expose either the first source electrode S1 or first drain electrode D1 of the main thin-film transistor TFT, and the first pixel electrode 121 may be electrically connected to the main thin-film transistor TFT by contacting with the first source electrode S1 or the first drain electrode D1 through the via hole. In an embodiment, a via hole may be defined through the planarization layer 117 in to expose one of the second source electrode S2 and second drain electrode D2 of the auxiliary thin-film transistor TFT', and the second pixel electrode 121' may be electrically connected to the auxiliary thin-film transistor TFT' by contacting with the second source electrode S2 or the second drain electrode D2 through the via hole.

The first pixel electrode 121 and the second pixel electrode 121' may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). The first pixel electrode 121 and the second pixel electrode 121' may include a reflective film including Ag, Mg, Al, Pt, Pd, Au, Ni, Nd, Ir, Cr, or a compound thereof. In one embodiment, for example, the first pixel electrode 121 and the second pixel electrode 121' may include a structure including films including or made of ITO, IZO, ZnO or $In_2O_3$ above and below the above-described reflective film. In one embodiment, for example, the first pixel electrode 121 and the second pixel electrode 121' may include a stacked structure of ITO/Ag/ITO.

A pixel defining layer 119 may cover each of edges of the first pixel electrode 121 and the second pixel electrode 121', on the planarization layer 117, a first opening OP1 and a second opening OP2, respectively exposing central portions of the first pixel electrode 121 and second pixel electrode 121', may be defined through the pixel defining layer 119. The first opening OP1 and the second opening OP2 define the size and shape of emission areas of the OLEDs OLED and OLED', that is, the sub-pixels Pm and Pa.

The pixel defining layer 119 increases a distance between the edges of the pixel electrodes 121 and 121' and the opposite electrode 123 above the pixel electrodes 121 and 121', thereby preventing arcs or the like from occurring in the edges of the pixel electrodes 121 and 121'. The pixel defining layer 119 may include or be formed of an organic insulating material such as PI, polyamide, acrylic resin, BCB, HMDSO, and phenol resin by a spin coating or the like.

In an embodiment, a third hole H3 may be defined through the pixel defining layer 119 in the transmission area TA. The third hole H3 may overlap the first hole H1 and the second hole H2. In such an embodiment, light transmittance in the transmission area TA may be improved by the first hole H1 through the third hole H3. In an embodiment, as shown in FIG. 7, the buffer layer 111 is continuously disposed in the transmission area TA, but alternatively, a hole may be defined through the buffer layer 111 in the transmission area TA. A portion of the opposite electrode 123 to be described later below may be disposed on inner side surfaces of the first hole H1 through the third hole H3.

A first emission layer 122b and a second emission layer 122b' that are disposed to correspond to the first pixel electrode 121 and the second pixel electrode 121', respectively, are disposed in the first opening OP1 and the second opening OP2 of the pixel defining layer 119. The first emission layer 122b and the second emission layer 122b' may include a high molecular weight material or a low molecular weight material and may emit red, green, blue, or white light.

An organic functional layer 122e may be disposed above and/or below the first emission layer 122b and the second emission layer 122b'. The organic functional layer 122e may include a first functional layer 122a and/or second functional layer 122c. Alternatively, the first functional layer 122a or second functional layer 122c may be omitted.

The first functional layer 122a may be disposed under the first emission layer 122b and the second emission layer 122b'. The first functional layer 122a may be a single layer or multiple layers, each layer including or made of an organic material. The first functional layer 122a may be a single layer with a hole transport layer ("HTL"). Alternatively, the first functional layer 122a may include a hole injection layer ("HIL") and a HTL. The first functional layer 122a may be integrally formed to correspond to the OLEDs OLED and OLED' that are included in the main display area MDA and the component area CA, respectively.

The second functional layer 122c may be disposed on the first emission layer 122b and the second emission layer 122b'. The second functional layer 122c may be a single layer or multiple layers, each layer including or made of an organic material. The second functional layer 122c may include an electron transport layer ("ETL") and/or electron injection layer ("EIL"). The second functional layer 122c may be integrally formed to correspond to the OLEDs OLED and OLED' that are included in the main display area MDA and the component area CA, respectively.

The opposite electrode 123 is disposed on the second functional layer 122c. The opposite electrode 123 may include a conductive material having a low work function. In one embodiment, for example, the opposite electrode 123 may include a (semi)transparent layer that contains Ag, Mg, Al, Pt, Pd, Au, Ni, Nd, Ir, chromium (Cr), lithium (Li), Ca, or an alloy thereof. Alternatively, the opposite electrode 123 may further include a layer made of, for example, ITO, IZO, ZnO, or $In_2O_3$ on a (semi)transparent layer including at least one selected from the aforementioned materials. The opposite electrode 123 may be integrally formed to correspond to the OLEDs OLED and OLED' that are included in the main display area MDA and the component area CA, respectively.

Layers from the first pixel electrode 121 through the opposite electrode 123 formed in the main display area MDA may collectively define the main OLED OLED. Layers from the second pixel electrode 121' to the opposite electrode 123 formed in the component area CA may collectively define the auxiliary OLED OLED'.

A capping layer (not shown) including an organic material may be disposed on the opposite electrode 123. The capping layer may be a layer provided to protect the opposite electrode 123 and to increase light extraction efficiency. The capping layer may include an organic material having a higher refractive index than the opposite electrode 123.

In an embodiment, a transmission hole TAH may be defined through the opposite electrode 123 to correspond to the transmission area TA. The transmission hole TAH corresponding to the transmission area TA may mean that the transmission hole TAH overlaps the transmission area TA. FIG. 7 shows an embodiment where the area of the transmission hole TAH is greater than the area of the first hole H1 in the inorganic insulating layer IL. However, the disclosure is not limited to thereto. In an alternative embodiment, the area of the transmission hole TAH may be less than or equal to the area of the first hole H1.

In such an embodiment, a portion of the opposite electrode 123 is not present in the transmission area TA due to the transmission hole TAH, and thus, light transmittance in the transmission area TA may be effectively increased. The opposite electrode 123 with the transmission hole TAH may be formed by using various methods. According to an embodiment, after a material for forming the opposite electrode 123 is deposited on the entire surface of the substrate 100, a portion of the deposited material that corresponds to the transmission area TA is removed via laser lift off, and thus, the opposite electrode 123 with the transmission hole TAH may be formed. According to an alternative embodiment, the opposite electrode 123 with the transmission hole TAH may be formed by metal self patterning ("MSP"). According to another alternative embodiment, the opposite electrode 123 with the transmission hole TAH may be formed via a deposition method using a fine metal mask ("FMM").

The bottom metal layer BML of the component area CA may be provided to correspond to the entire component area CA. In such an embodiment, e a bottom-hole BMLH that overlaps the transmission area TA may be defined through the bottom metal layer BML. In an embodiment, a shape and size of the bottom-hole BMLH may define a shape and size of the transmission area TA.

The thin-film encapsulation layer TFEL may be disposed as a sealing member ENCM on the display element layer EDL of the display panel 10. In an embodiment, the OLEDs OLED and OLED' may be sealed by the thin-film encapsulation layer TFEL. The thin-film encapsulation layer TFEL may be disposed on the opposite electrode 123. The thin-film encapsulation layer TFEL may prevent external moisture or foreign substances from penetrating into the OLEDs OLED and OLED'.

The thin-film encapsulation layer TFEL may include at least one inorganic encapsulation layer and at least one organic encapsulation layer. In an embodiment, as shown in FIG. 7, the thin-film encapsulation layer TFEL has a structure in which the first inorganic encapsulation layer 131, the organic encapsulation layer 132, and the second inorganic encapsulation layer 133 are stacked one on another. In an alternative embodiment, the number of the organic encapsulation layers, the number of the inorganic encapsulation layers, and a stacking order thereof may be variously modified.

The first inorganic encapsulation layer 131 and the second inorganic encapsulation layer 133 may include one or more inorganic insulating materials such as $SiO_x$, $SiN_x$, SiON, $Al_2O_3$, $TiO_2$, $Ta_2O_5$, $HfO_2$, or $ZnO_2$, and may be formed by a chemical vapor deposition ("CVD") or the like. The organic encapsulation layer 132 may include a polymer-based material. The polymer-based material may include at least one selected from silicone-based resin, acrylic-based resin, epoxy-based resin, PI, polyethylene, and the like.

Each of the first inorganic encapsulation layer 131, the organic encapsulation layer 132, and the second inorganic encapsulation layer 133 may be integrally formed to cover the main display area MDA and the component area CA. Accordingly, the first inorganic encapsulation layer 131, the organic encapsulation layer 132, and the second inorganic encapsulation layer 133 may be disposed inside the first hole H1 of the inorganic insulating layer IL.

In an embodiment, the substrate 100 may include a first base layer 101, a first barrier layer 102, a second base layer 103, a compensation layer 106, and a second barrier layer 104 that are sequentially stacked one on another.

The first base layer 101 and the second base layer 103 may include or be made of polymer resins having high heat resistance. In one embodiment, for example, the first base layer 101 and the second base layer 103 may include at least one material selected from polyethersulfone ("PES"), polyacrylate ("PAR"), polyetherimide ("PEI"), polyethylene naphthalate ("PEN"), PET, polyphenylene sulfide ("PPS"), polyarylate, PI, polycarbonate ("PC"), cellulose triacetate ("TAC"), cellulose acetate propionate ("CAP"), and poly (aryleneether sulfone).

In such an embodiment, PI has high mechanical strength, and has a glass transition temperature of 450° C., and thus has high heat resistance as compared to other polymer resins. In an embodiment, where the first base layer 101 and the second base layer 103 include or are made of PI, the substrate may be effectively maintained without sagging due to the weight of the first barrier layer 102, the compensation layer 106, and the second barrier layer 104, even when a process of forming the first barrier layer 102, the compensation layer 106, and the second barrier layer 104 on the second base layer 103 proceeds at a high temperature. In an embodiment, where the first base layer 101 and the second base layer 103 that contain PI and the above-described polymer resin have high permeability to oxygen and moisture. Therefore, in such an embodiment, the first barrier layer 102 and the second barrier layer 104 that block oxygen and moisture permeation may be provided between the first base layer 101 and the second base layer 103 and above the second base layer 103.

In an embodiment where the first base layer 101 and the second base layer 103 include or are made of PI, a refractive index n1 of the first base layer 101 and a refractive index n3 of the second base layer 103 have a value of about 1.9 with respect to light having a wavelength of about 550 nanometers (nm). (n1, n3=1.9)

In an embodiment, a thickness t1 of the first base layer 101 may be greater than a thickness t3 of the second base layer 103. The first base layer 101 has a structure for supporting the components disposed thereon, and thus, providing a mechanical strength of the first base layer 101 higher than that of the second base layer 103 may be more stable for the process. In an embodiment, the thickness t1 of the first base layer 101 may be in a range of about 9 micrometers (μm) to about 11 μm, and the thickness t3 of the second base layer 103 may be in a range of about 5 μm to about 7 μm.

The first barrier layer 102 and the second barrier layer 104 are each made of $SiO_x$, and impurities such as oxygen and moisture may be prevented from penetrating from the outside to the upper portion of the substrate 100. A refractive index n2 of the first barrier layer 102 and a refractive index n4 of the second barrier layer 104 have a value of about 1.45 with respect to light having a wavelength of 550 nm. (n2, n4=1.45)

The thicknesses t2 and t4 of the first barrier layer 102 and the second barrier layer 104, respectively, may be in a range of about 3000 angstrom (Å) to about 6000 Å. In such an embodiment, a blocking rate of moisture and oxygen may be remarkably decreased when a thickness of each of the first barrier layer 102 and the second barrier layer 104 is less than about 3000 Å, and a processing time for film formation may be rapidly increased when a thickness of each of the first barrier layer 102 and the second barrier layer 104 is greater than about 6000 Å.

In an embodiment, the compensation layer 106 is disposed between the second base layer 103 and the second barrier layer 104. The compensation layer 106 may a structure for improving light transmittance in the transmission area TA. The compensation layer 106 includes or is made of silicon oxynitride ($SiO_xN_y$, where x>0 and y>0) and a refractive index n6 of the compensation layer 106 may have a value between a refractive index n3 of the second base layer 103 and a refractive index n4 of the second barrier layer 104.

$SiO_xN_y$ in the compensation layer 106 may adjust a refractive index n6 of the compensation layer 106 based on a ratio of oxygen and nitrogen. In one embodiment, for example, when an amount of oxygen increases, the refractive index n6 may decrease, and when an amount of nitrogen increases, the refractive index n6 may increase. Accordingly, in such an embodiment, the refractive index n6 of the compensation layer 106 may be adjusted to be between about 1.5 and about 1.8 by adjusting the ratio of oxygen and nitrogen. In an embodiment, the refractive index n6 of the compensation layer 106 may be in a range of about 1.65 to about 1.75. In a case of $SiN_x$ that does not contain oxygen, the refractive index is about 1.9, which is similar to a refractive index of PI, and thus, $SiN_x$ may not be appropriate for the compensation layer 106.

In a case where the compensation layer 106 is not provided and the second base layer 103 and the second barrier layer 104 are in direct contact with each other, light may not be transmitted and may be lost due to a difference between the refractive index n3 of the second base layer 103 and the refractive index n4 of the second barrier layer 104. In an embodiment, a refractive index n6 of the compensation layer 106 has a value between a refractive index n3 of the second base layer 103 and a refractive index n4 of the second barrier layer 104, and thus, an amount of light loss may be reduced.

In an embodiment, a thickness t6 of the compensation layer 106 may be in a range of about 500 Å to about 2000 Å. In such an embodiment, the thickness t6 of the compensation layer 106 is desired to be about 500 Å or more because the above-described thickness is the minimum thickness capable of improving the light transmittance. In such an embodiment, a thickness of the compensation layer 106 is desired to be about 2000 Å or less for the following reasons. In such an embodiment, the compensation layer 106 includes or is made of $SiO_xN_y$, and contains a nitrogen component. This nitrogen component may escape from $SiN_xN_y$ in a high-temperature process to be proceeded later, and may cause a dehydrogenation phenomenon in which $SiN_xN_y$ is combined with hydrogen atoms in the semiconductor layers A1 and A2, such that the characteristics of the semiconductor layers A1 and A2 may be changed. Accordingly, in such an embodiment, the compensation layer 106 may be deposited to a thickness of, for example, about 2000 Å or less, in which no dehydrogenation phenomenon occurs.

Although not shown in the drawing, in an embodiment, the compensation layer 106 may also be disposed between the first base layer 101 and the first barrier layer 102. FIGS. 7 and 8 show an embodiment in which the compensation layer 106 is disposed only on the second base layer 103 and the second barrier layer 104.

In an embodiment, the first barrier layer 102, the second barrier layer 104, and the compensation layer 106 may be deposited by plasma-enhanced CVD ("PECVD") using plasma. However, the disclosure is not limited thereto, and alternatively, the first barrier layer 102, the second barrier layer 104, and the compensation layer 106 may be deposited by using other various deposition methods such as atmospheric pressure CVD ("APCVD"), low pressure CVD ("LPCVD"), or the like.

Referring to FIGS. 7 and 8, the buffer layer 111 and the inorganic insulating layer IL are removed from the transmission area TA, and thus, the organic functional layer 122e and the thin-film encapsulation layer TFEL are sequentially stacked above the substrate 100 in the transmission area TA. In an embodiment, where the transmission hole TAH of the opposite electrode 123 is formed by a laser lift off process, the organic functional layer 122e may also be removed from the transmission area TA. In such an embodiment, the first inorganic encapsulation layer 131 of the thin-film encapsulation layer TFEL comes into direct contact with the second barrier layer 104 of the substrate 100, and thus, the bonding strength may be enhanced by inorganic-inorganic contact.

As described above, in embodiments of the display panel and the display apparatus, the buffer layer 111 and the inorganic insulating layer IL are removed from the transmission area TA simultaneously with the introduction of the compensation layer 106 into the substrate 100, and thus, light transmittance in the component area CA may be improved.

Figure 9:
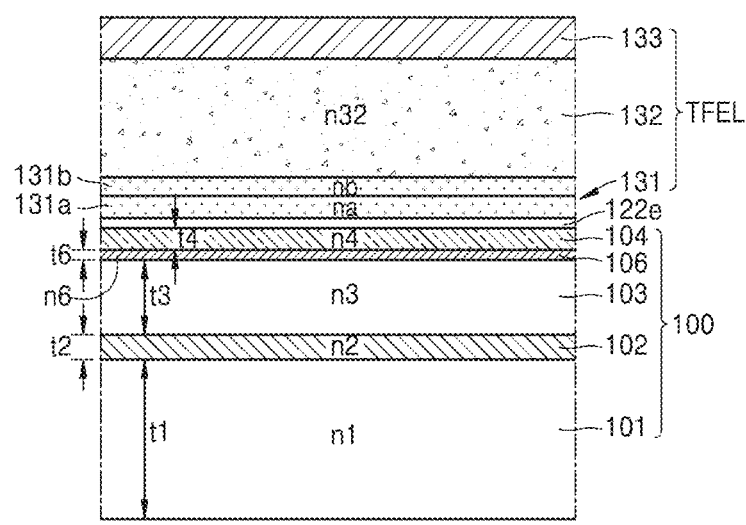
FIG. 9 is a cross-sectional view illustrating a part of a display panel according to an alternative embodiment, and showing a stacked structure in a transmission area.

FIG. 9 is a cross-sectional view illustrating part of a display panel according to an alternative embodiment and showing a stacked structure in a transmission area TA. In FIG. 9, the same or like reference numerals as those in FIG. 8 denote the same or like elements, and any repetitive detailed descriptions thereof will be omitted.

Referring to FIG. 9, the substrate 100 includes the first base layer 101, the first barrier layer 102, the second base layer 103, the compensation layer 106, and the second barrier layer 104 that are sequentially stacked one on another, and a refractive index n6 of compensation layer 106 has a value between the refractive index n3 of the second base layer 103 and the refractive index n4 of the second barrier layer 104.

In an embodiment, the compensation layer 106 may include or be made of $SiO_xN_y$, where x>0 and y>0. The refractive index n6 of the compensation layer 106 may be adjusted to be between about 1.5 and about 1.8. In an embodiment, the refractive index n6 of the compensation layer 106 may be in a range of about 1.65 to about 1.75.

The thickness t6 of the compensation layer 106 may be in a range of about 500 Å to about 2000 Å. Accordingly, the effect of dehydrogenation by nitrogen in the high-temperature process may be substantially reduced.

In such an embodiment, the first inorganic encapsulation layer 131 of the thin-film encapsulation layer TFEL may be provided by stacking a first refractive index layer 131a and a second refractive index layer 131b disposed thereon. A refractive index na of the first refractive index layer 131a may be greater than a refractive index nb of the second refractive index layer 131b. In an embodiment, the first refractive index layer 131a includes or is made of $SiO_xN_y$ (where x>0, y>0) and may have a refractive index na in a range of about 1.6 to about 1.7. The second refractive index layer 131b includes or is made of $SiO_xN_y$ (where x>0 and y>0) and may have a refractive index na in a range of about 1.5 to about 1.6. According to an embodiment, a refractive index na of the first refractive index layer 131a may be less than a refractive index nb of the second refractive index layer 131b.

In an embodiment, a refractive index n22 of the organic functional layer 122e may be about 1.9, and a refractive index n32 of the organic encapsulation layer 132 may be about 1.5. Accordingly, the difference in refractive index at an interface between layers may be substantially reduced by adjusting a refractive index of the first inorganic encapsulation layer 131 disposed between the organic functional layer 122e and the organic encapsulation layer 132. Accordingly, light transmittance may increase. In such an embodiment, when the first inorganic encapsulation layer 131 includes the first refractive index layer 131a and the second refractive index layer 131b, fluctuation of light transmittance according to the wavelength may be reduced. In an embodiment, a thickness of the first inorganic encapsulation layer 131 may be in a range of about 1 µm to about 1.2 µm.

Figure 10:
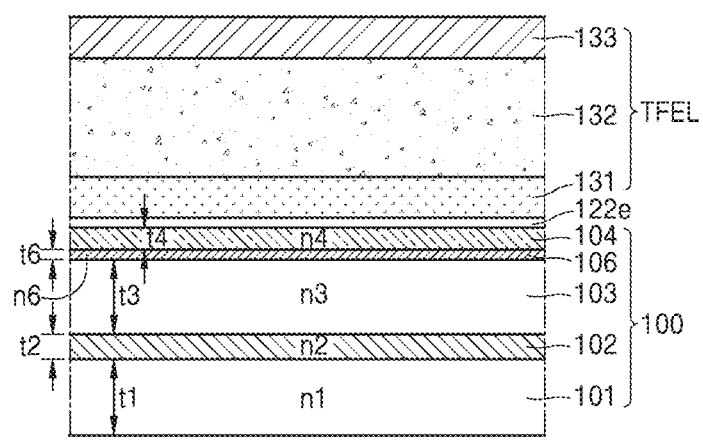
FIG. 10 is a cross-sectional view illustrating a part of a display panel according to another alternative embodiment, and showing a stacked structure in a transmission area.

FIG. 10 is a cross-sectional view showing part of a display panel according to another alternative embodiment, and showing a stacked structure in a transmission area TA. In FIG. 10, the same or like reference numerals as those in FIG. 8 denote the same or like elements, and any repetitive detailed descriptions thereof will be omitted.

Referring to FIG. 10, the substrate 100 includes the first base layer 101, the first barrier layer 102, the second base layer 103, the compensation layer 106, and the second barrier layer 104 that are sequentially stacked one on another, and a refractive index n6 of the compensation layer 106 has a value between a refractive index n3 of the second base layer 103 and a refractive index n4 of the second barrier layer 104.

In an embodiment, the compensation layer 106 may include or be made of $SiO_xN_y$, where x>0 and y>0. A refractive index n6 of the compensation layer 106 may be adjusted to be between about 1.5 and about 1.8. In an embodiment, a refractive index n6 of the compensation layer 106 may be in a range of about 1.65 to about 1.75.

A thickness t6 of the compensation layer 106 may be in a range of about 500 Å to about 2000 Å. Accordingly, the effect of dehydrogenation by nitrogen in a high-temperature process may be substantially reduced.

In such an embodiment, a thickness t1 of the first base layer 101 is in a range of about 5 µm to about 7 µm, which may be substantially the same as a thickness t3 of the second base layer 103. In such an embodiment, light loss due to the first base layer 101 may be significantly reduced. Therefore, light transmittance in the component area CA may increase.

Figure 11:
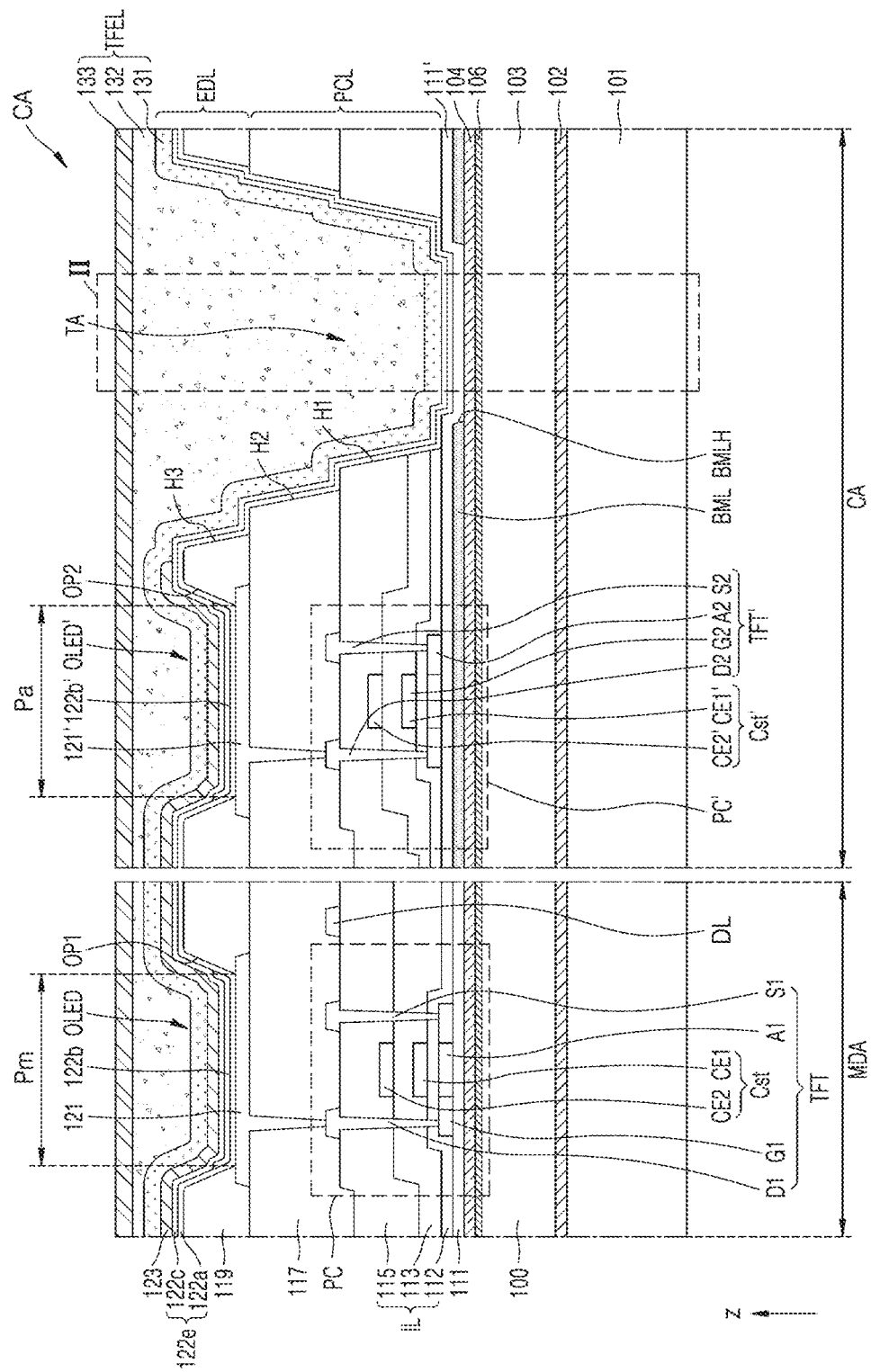
FIG. 11 shows a schematic cross-sectional view illustrating a part of a display panel according to an alternative embodiment and schematically illustrating a main display area and a component area.
Figure 12:
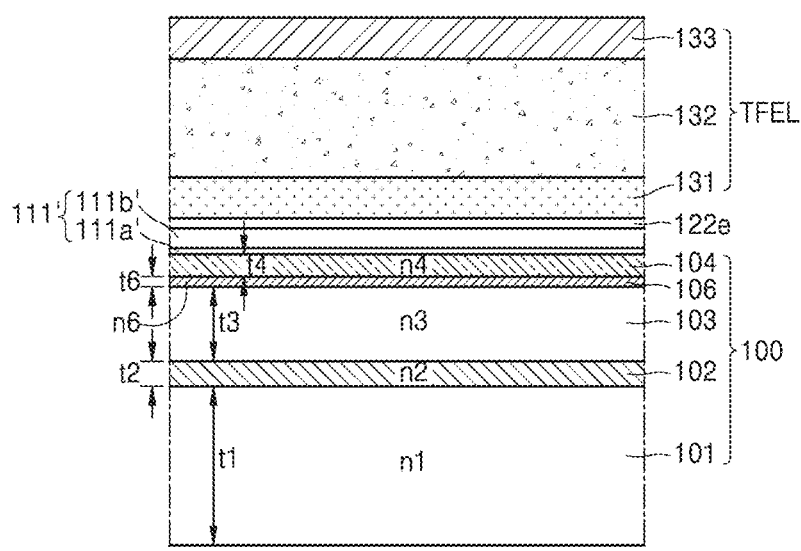
FIG. 12 is a cross-sectional view corresponding to region II of FIG. 11 and schematically illustrating a stacked structure of the transmission area.

FIG. 11 is a schematic cross-sectional view illustrating part of the display panel 10 according to an alternative embodiment, and a cross-sectional view schematically illustrating the main display area MDA and the component area CA. FIG. 12 is a cross-sectional view corresponding to region I of FIG. 11 and schematically illustrating a stacked structure of a transmission area TA. In FIGS. 11 and 12, the same or like reference numerals as those in FIG. 7 denote the same or like elements, and any repetitive detailed descriptions thereof will be omitted.

Referring to FIGS. 11 and 12, according to an embodiment, a buffer layer 111' may be continuously disposed without being removed from the transmission area TA. Generally, a dry etching process is used to remove the buffer layer 111', and it may be difficult to uniformly remove only the buffer layer 111'.

In such an embodiment, the buffer layer 111' include or is formed of materials that are capable of significantly reducing the influence on the light transmittance of the transmission area TA even when the buffer layer 111' is removed from the transmission area TA.

The buffer layer 111' may include a first buffer layer 111a' including $SiN_x$ and a second buffer layer 111b' including $SiO_x$. In an embodiment, the buffer layer 111' may be provided by stacking the first buffer layer 111a' made of $SiN_x$ and the second buffer layer 111b' made of $SiO_x$. The first buffer layer 111a' may have a thickness in a range of about 80 Å to about 250 Å. When the first buffer layer 111a' has a thickness of less than about 80 Å, it may be difficult to be formed in a film shape, and when the first buffer layer 111a' has a thickness of greater than 250 Å, light transmittance may degraded. In an embodiment, where the buffer layer 111' is disposed close to the semiconductor layers A1 and A2, nitrogen of silicon nitride ($SiN_x$) contained in the buffer layer 111', unlike nitrogen contained in the substrate 100, may serve to improve the characteristics of the semiconductor layers A1 and A2 by supplying an appropriate amount of hydrogen to the semiconductor layers A1 and A2. Therefore, the buffer layer 111', for example, includes the first buffer layer 111a' including or made of $SiN_x$, and when light transmittance is taken into account, the first buffer layer 111a' has a thickness in a range of, for example, about 80 Å to about 250 Å.

A thickness of the second buffer layer 111b' may be in a range of about 1000 Å to about 4000 Å. In such an embodiment, the buffer layer may not effectively perform desired functions thereof when a thickness of the second buffer layer 111b' is less than about 1000 Å, and a process time for forming a film increases rapidly when the thickness of the second buffer layer 111b' exceeds about 4000 Å.

The substrate 100 includes the first base layer 101, the first barrier layer 102, the second base layer 103, the compensation layer 106, and the second barrier layer 104 that are sequentially stacked one on another, and a refractive index n6 of compensation layer 106 has a value between a refractive index n3 of the second base layer 103 and a refractive index n4 of the second barrier layer 104.

In an embodiment, the compensation layer 106 may include or be made of $SiO_xN_y$, where x>0 and y>0. A refractive index n6 of the compensation layer 106 may be adjusted to be between about 1.5 and about 1.8. In an embodiment, a refractive index n6 of the compensation layer 106 may be in a range of about 1.65 to about 1.75.

A thickness t6 of the compensation layer 106 may be in a range of about 500 Å to about 2000 Å. Therefore, the effect of dehydrogenation by nitrogen in a high-temperature process may be effectively reduced.

Figure 13:
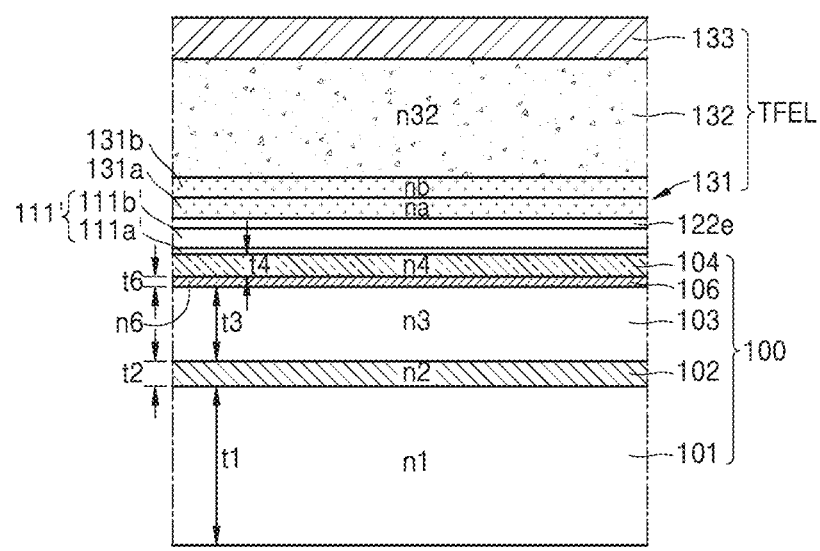
FIG. 13 is a cross-sectional view illustrating a part of a display panel according to an alternative embodiment, and showing a stacked structure in a transmission area.

FIG. 13 is a cross-sectional view showing part of a display panel according to another alternative embodiment, and showing a stacked structure in a transmission area TA. In FIG. 13, the same or like reference numerals as those in FIG. 11 denote the same or like elements, and any repetitive detailed descriptions thereof will be omitted.

Referring to FIG. 13, the substrate 100 includes the first base layer 101, the first barrier layer 102, the second base layer 103, the compensation layer 106, and the second barrier layer 104 that are sequentially stacked one on another, and a refractive index n6 of the compensation layer 106 has a value between a refractive index n3 of the second base layer 103 and a refractive index n4 of the second barrier layer 104.

In an embodiment, the compensation layer 106 may include or be made of $SiO_xN_y$, where x>0 and y>0. A refractive index n6 of the compensation layer 106 may be adjusted to be between about 1.5 and about 1.8. In an embodiment, a refractive index n6 of the compensation layer 106 may be in a range of about 1.65 to about 1.75. A thickness t6 of the compensation layer 106 may be in a range of about 500 Å to about 2000 Å. Therefore, the effect of dehydrogenation by nitrogen in a high-temperature process may be effectively reduced.

In the transmission area TA, the buffer layer 111' may be provided above the substrate 100. The buffer layer 111' may be provided by stacking a first buffer layer 111a' including or made of $SiN_x$ and a second buffer layer 111b' including or made of $SiO_x$. The first buffer layer 111a' may have a thickness in a range of about 80 Å to about 250 Å. A thickness of the second buffer layer 111b' may be in a range of about 1000 Å to about 4000 Å.

According to an embodiment, the first inorganic encapsulation layer 131 of the thin-film encapsulation layer TFEL may be provided by stacking a first refractive index layer 131a and a second refractive index layer 131b disposed thereon. A refractive index na of the first refractive index layer 131a may be greater than a refractive index nb of the second refractive index layer 131b. In an embodiment, the first refractive index layer 131a includes or is made of $SiO_xN_y$ (where x>0 and y>0) and may have a refractive index na in a range of about 1.6 to about 1.7. The second refractive index layer 131b includes or is made of $SiO_xN_y$ (where x>0 and y>0) and may have a refractive index na in a range of about 1.5 to about 1.6. According to an embodiment, a refractive index na of the first refractive index layer 131a may be less than a refractive index nb of the second refractive index layer 131b.

In some embodiments, a refractive index n22 of the organic functional layer 122e may be about 1.9, and a refractive index n32 of the organic encapsulation layer 132 may be about 1.5. Accordingly, the difference in refractive index at an interface between layer may be reduced by adjusting a refractive index of the first inorganic encapsulation layer 131 disposed between the organic functional layer 122e and the organic encapsulation layer 132. Therefore, light transmittance may increase. In such an embodiment, where the first inorganic encapsulation layer 131 includes the first refractive index layer 131a and the second refractive index layer 131b, fluctuation of light transmittance according to the wavelength may be reduced. In an embodiment, a thickness of the first inorganic encapsulation layer 131 may be in a range of about 1 μm to about 1.2 μm.

Figure 14:
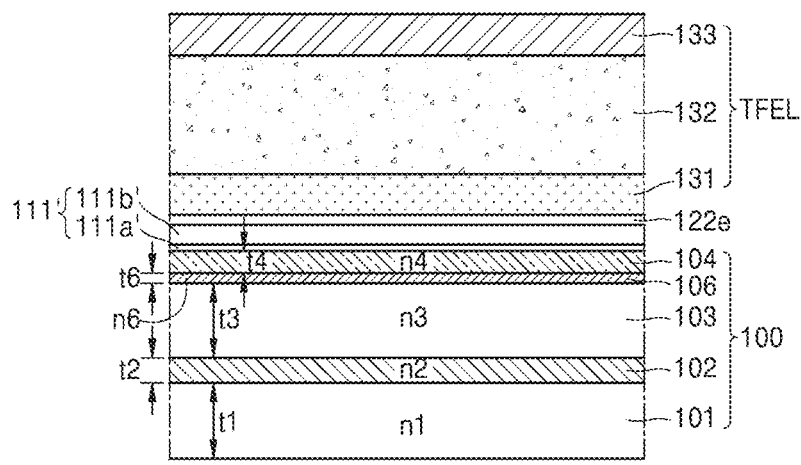
FIG. 14 is a cross-sectional view illustrating a part of a display panel according to another alternative embodiment, and showing a stacked structure in a transmission area.

FIG. 14 is a cross-sectional view showing part of a display panel according to another alternative embodiment, and showing a stacked structure in a transmission area TA. In FIG. 14, the same or like reference numerals as those in FIG. 11 denote the same or like elements, and any repetitive detailed descriptions thereof will be omitted.

Referring to FIG. 14, the substrate 100 includes the first base layer 101, the first barrier layer 102, the second base layer 103, the compensation layer 106, and the second barrier layer 104 that are sequentially stacked one on another, and a refractive index n6 of compensation layer 106 has a value between a refractive index n3 of the second base layer 103 and a refractive index n4 of the second barrier layer 104.

In an embodiment, a compensation layer 106 may include or be made of $SiO_xN_y$, where x>0 and y>0. A refractive index n6 of the compensation layer 106 may be adjusted to be between about 1.5 and about 1.8. In an embodiment, a refractive index n6 of the compensation layer 106 may be in a range of about 1.65 to about 1.75. A thickness t6 of the compensation layer 106 may be in a range of about 500 Å to about 2000 Å. Accordingly, the effect of dehydrogenation by nitrogen in a high-temperature process may be effectively prevented.

In an embodiment, the buffer layer 111' may be provided above the substrate 100 in the transmission area TA. The buffer layer 111' may be provided by stacking a first buffer layer 111a' made of $SiN_x$ and a second buffer layer 111b' made of $SiO_x$. The first buffer layer 111a' may have a thickness in a range of about 100 Å to about 250 Å. A thickness of the second buffer layer 111b' may be in a range of about 1000 Å to about 4000 Å.

In such an embodiment, a thickness t1 of the first base layer 101 is in a range of about 5 μm to about 7 μm, which may be substantially the same as a thickness t3 of the second base layer 103. In such an embodiment, light loss due to the first base layer 101 may be significantly or effectively reduced. Therefore, light transmittance in the component area CA may be increased.

Figure 15:
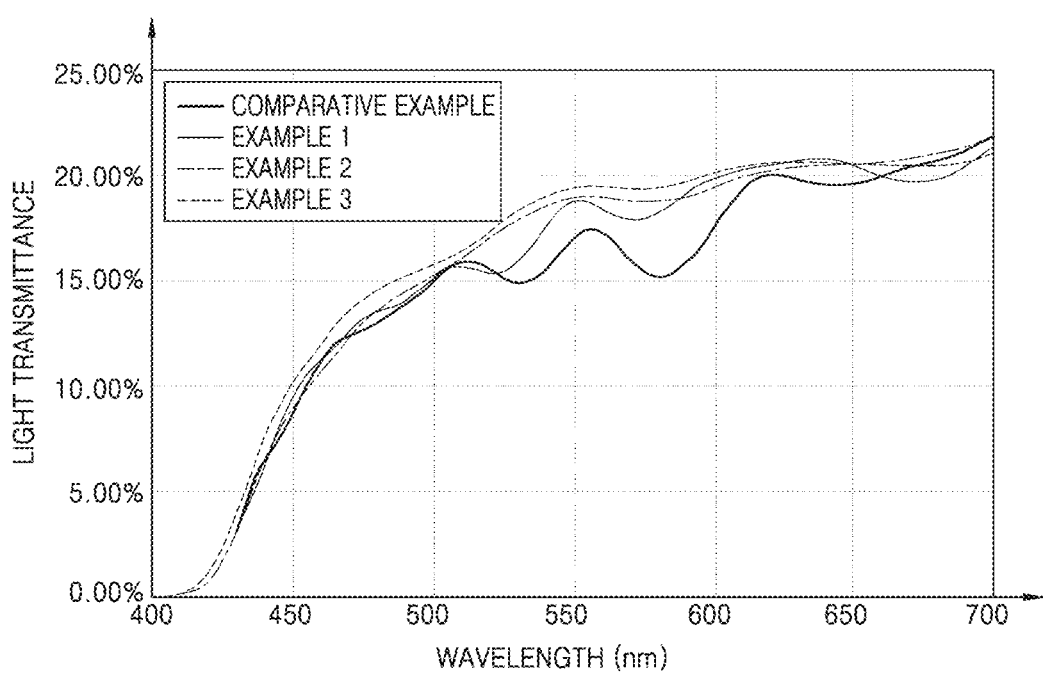
FIG. 15 is a graph showing light transmittance in a component area, according to embodiments.

FIG. 15 is a graph showing light transmittance in a component area CA, according to embodiments. The graphs in FIG. 15 indicates light transmittance in the component area CA in a state in which the substrate 100, the display element layer DISL, the touch screen layer TSL, a polarizing film as the optical functional layer OFL, and the cover window 50 are combined with one another, as shown in FIG. 2.

Comparative Example shows a case having a substantially the same structure as the embodiment of FIG. 11, except that the compensation layer 106 is not applied to the substrate 100 and the first buffer layer 111a of the buffer layer 111' has a thickness of 500 Å. In Comparative Example, light having a wavelength of 550 nm has a light transmittance of about 17.03%.

Example 1 corresponds to the embodiment of FIGS. 11 and 12, in which the compensation layer 106 is included in the substrate 100 and the first buffer layer 111a has a thickness of 100 Å. Example 1 is a light transmittance of about 19% with respect to light having a wavelength of 550 nm. That is, it may be understood that light transmittance is improved as compared to the case in Comparative Example.

Example 2 corresponds to the embodiment of FIG. 13, in which the first inorganic encapsulation layer 131 has a structure in which the first refractive index layer 131a and the second refractive index layer 131b that have different refractive indices are stacked. Example 2 shows a light transmittance of about 19.1% with respect to light having a wavelength of 550 nm. Thus, it may be understood that fluctuation according to the wavelength has decreased.

Example 3 corresponds to an embodiment where the embodiment of FIG. 14 is applied in addition to the embodiment of FIG. 13, and in this case, the first inorganic encapsulation layer 131 has a structure in which the first refractive index layer 131a and the second refractive index layer 131b are stacked, and a thickness of the first base layer 101 is substantially similar to a thickness of the second base layer 103. In Example 3, thicknesses of the first base layer 101 and the second base layer 103 are about 5.8 μm. Example 3 shows a light transmittance of about 19.3% with respect to light having a wavelength of 550 nm, in which light transmittance is improved and fluctuations with wavelengths are reduced.

As described above, in embodiments of a display panel and a display apparatus according to the disclosure, light transmittance in the component area CA may be improved by employing a compensation layer.

As described above, embodiments of a display panel and a display apparatus include a compensation layer for improving light transmittance, above the substrate, and thus, light transmittance in the component area may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
a substrate including a main display area and a component area, wherein the component area comprises a plurality of pixel groups spaced apart from one another and a transmission area between the pixel groups;
an inorganic insulating layer disposed on the substrate, wherein a first hole is defined through the inorganic insulating layer to correspond to the transmission area; and
a plurality of main display elements disposed on the inorganic insulating layer in the main display area;
wherein the substrate comprises a first base layer, a first barrier layer, a second base layer, a compensation layer, and a second barrier layer,
the compensation layer is disposed between the second base layer and the second barrier layer, and
a refractive index of the compensation layer has a value between a refractive index of the second base layer and a refractive index of the second barrier layer.

2. The display panel of claim 1, wherein
the second barrier layer comprises silicon oxide, and
the compensation layer comprises silicon oxynitride.

3. The display panel of claim 1, wherein a refractive index of the compensation layer is in a range of about 1.65 to about 1.75.

4. The display panel of claim 1, wherein a thickness of the compensation layer is in a range of 500 Å to about 2000 Å.

5. The display panel of claim 1, wherein the first base layer and the second base layer comprises polyimide.

6. The display panel of claim 1, wherein a thickness of the first base layer is greater than a thickness of the second base layer.

7. The display panel of claim 1, further comprising:
a buffer layer disposed between the substrate and the inorganic insulating layer,
wherein a buffer-hole is defined through the buffer layer to correspond to the transmission area.

8. The display panel of claim 1, further comprising:
a thin-film encapsulation layer disposed on the main display elements,
wherein the thin-film encapsulation layer comprises a first inorganic encapsulation layer, an organic encapsulation layer, and a second inorganic encapsulation layer, which are sequentially stacked one on another and
the first inorganic encapsulation layer comprises a first refractive index layer and a second refractive index layer, which are stacked one on another,
wherein the first refractive index and the second refractive index layer have different refractive indices from each other.

9. The display panel of claim 8, wherein
the first refractive index layer comprises silicon oxynitride ($SiO_xN_y$, where x>0 and y>0) and has a refractive index in a range of about 1.6 to about 1.7, and
the second refractive index layer comprises silicon oxynitride ($SiO_xN_y$, where x>0 and y>0) and has a refractive index in a range of about 1.5 to about 1.6.

10. The display panel of claim 1, wherein a thickness of the first base layer is substantially the same as a thickness of the second base layer.

11. The display panel of claim 1, further comprising:
a buffer layer disposed between the substrate and the inorganic insulating layer,
wherein the buffer layer comprises a first buffer layer and a second buffer layer on the first buffer layer,
the first buffer layer comprises silicon nitride, and
a thickness of the first buffer layer is in a range of about 80 Å to about 250 Å.

12. The display panel of claim 11, wherein
the second buffer layer comprises silicon oxide, and
a thickness of the second buffer layer is in a range of about 1000 Å to about 4000 Å.

13. The display panel of claim 1, further comprising:
a bottom metal layer disposed between the substrate and the inorganic insulating layer in the component area,
wherein a bottom-hole is defined through the bottom metal layer to correspond to the transmission area.

14. A display apparatus comprising:
a display panel, in which a display area comprising a plurality of main sub-pixels, and a component area comprising a plurality of pixel groups and a transmission area are defined; and
a component disposed under the display panel to correspond to the component area,
wherein the display panel comprises:
a substrate;
an inorganic insulating layer disposed on the substrate and having a first hole corresponding to the transmission area; and a plurality of main display elements disposed on the inorganic insulating layer in the display area, wherein the substrate comprises a first base layer, a first barrier layer, a second base layer, a compensation layer, and a second barrier layer, which are sequentially stacked one on another, and a refractive index of the compensation layer has a value between a refractive index of the second base layer and a refractive index of the second barrier layer.

15. The display apparatus of claim 14, wherein
the second barrier layer comprises silicon oxide, and
the compensation layer comprises silicon oxynitride, and has a thickness of about 500 Å to about 2000 Å.

16. The display apparatus of claim 15, wherein a refractive index of the compensation layer is in a range of about 1.65 to about 1.75.

17. The display apparatus of claim 14, further comprising:
a buffer layer disposed between the substrate and the inorganic insulating layer,
wherein a buffer-hole is defined through the buffer layer to correspond to the transmission area.

18. The display apparatus of claim 14, further comprising:
a thin-film encapsulation layer disposed on the main display elements,
wherein the thin-film encapsulation layer comprises a first inorganic encapsulation layer, an organic encapsulation layer, and a second inorganic encapsulation layer, which are sequentially stacked one on another, and wherein the first inorganic encapsulation layer comprises a first refractive index layer and a second refractive index layer, which are stacked one on another, wherein the first refractive index layer and the second index layer have different refractive indices from each other, wherein a refractive index of the first refractive index layer is in a range of about 1.6 to about 1.7, and a refractive index of the second refractive index layer is in a range of about 1.5 to about 1.6.

19. The display apparatus of claim 14, further comprising:
a buffer layer disposed between the substrate and the inorganic insulating layer,
wherein the buffer layer comprises a first buffer layer and a second buffer layer on the first buffer layer, which are stacked one on another,
wherein the first buffer layer comprises silicon nitride, and
a thickness of the first buffer layer is in a range of about 80 Å to about 250 Å.

20. The display apparatus of claim 19, wherein
the second buffer layer comprises silicon oxide, and
a thickness of the second buffer layer is in a range of about 1000 Å to about 4000 Å.

* * * * *